(12) United States Patent
Watanobe et al.

(10) Patent No.: US 7,511,330 B2
(45) Date of Patent: Mar. 31, 2009

(54) SEMICONDUCTOR DEVICE AND METHOD OF FABRICATING THE SAME

(75) Inventors: Hisashi Watanobe, Mie (JP); Tooru Hara, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 192 days.

(21) Appl. No.: 11/094,466

(22) Filed: Mar. 31, 2005

(65) Prior Publication Data

US 2005/0236660 A1 Oct. 27, 2005

(30) Foreign Application Priority Data

Mar. 31, 2004 (JP) ............................. 2004-107154

(51) Int. Cl.
*H01L 21/76* (2006.01)
*H01L 29/76* (2006.01)
(52) U.S. Cl. ..................... 257/314; 257/306; 257/394
(58) Field of Classification Search ................ 257/508, 257/E27.084, E21.657, 314, 394, 306
See application file for complete search history.

(56) References Cited

U.S. PATENT DOCUMENTS

| | | | | | |
|---|---|---|---|---|---|
| 5,338,700 | A | * | 8/1994 | Dennison et al. ............ | 438/253 |
| 5,519,239 | A | * | 5/1996 | Chu ............................ | 257/314 |
| 5,821,140 | A | * | 10/1998 | Jost et al. .................... | 438/241 |
| 6,028,004 | A | * | 2/2000 | Bronner et al. ............. | 438/657 |
| 6,359,301 | B1 | * | 3/2002 | Kuroda ....................... | 257/306 |
| 2001/0002719 | A1 | * | 6/2001 | Shimizu et al. ............. | 257/392 |
| 2005/0073000 | A1 | * | 4/2005 | Oyu et al. ................... | 257/314 |

FOREIGN PATENT DOCUMENTS

JP 6-310612 11/1994
JP 2002-198421 7/2002

\* cited by examiner

*Primary Examiner*—David S Blum
(74) *Attorney, Agent, or Firm*—Oblon, Spivak, McClelland, Maier & Neustadt, P.C.

(57) ABSTRACT

A semiconductor device includes a semiconductor substrate, a gate insulating film, gate electrodes, a first silicon oxide film, bit lines formed on the first silicon oxide film and including lower surfaces having respective recesses, a contact plug layer located between the gate electrodes and including a first portion, a second portion having a fourth side surface between the opposed second side surfaces of first silicon oxide film and a third portion having an upper surface and fifth side surfaces embedded in the respective recesses of the bit line, a first silicon nitride layer between a third side surface of the first portion of the contact plug and a first side surface of the gate electrode, and a second silicon oxide film. The entire upper surface and fifth side surface of the third portion of the contact plug directly contact with inner surfaces of the recesses respectively.

13 Claims, 31 Drawing Sheets

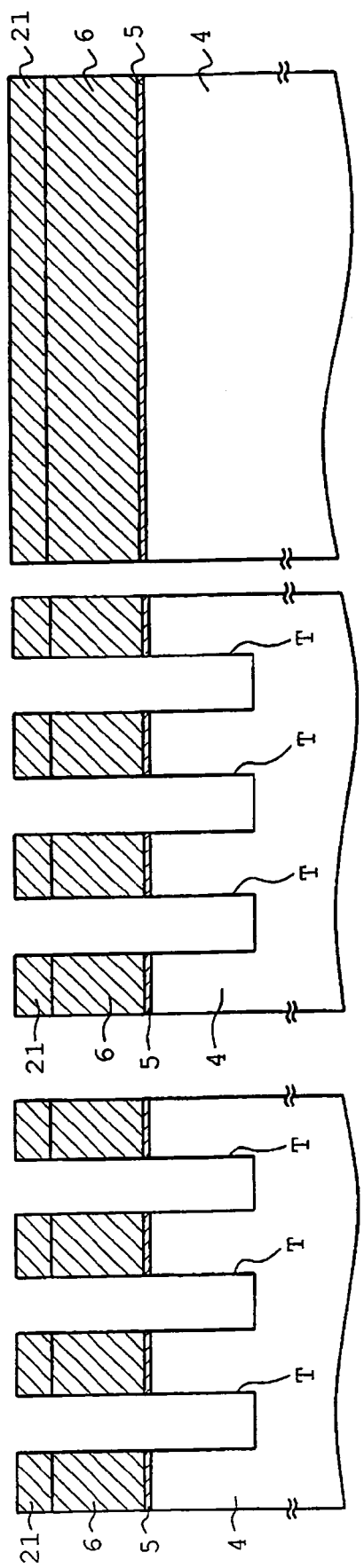

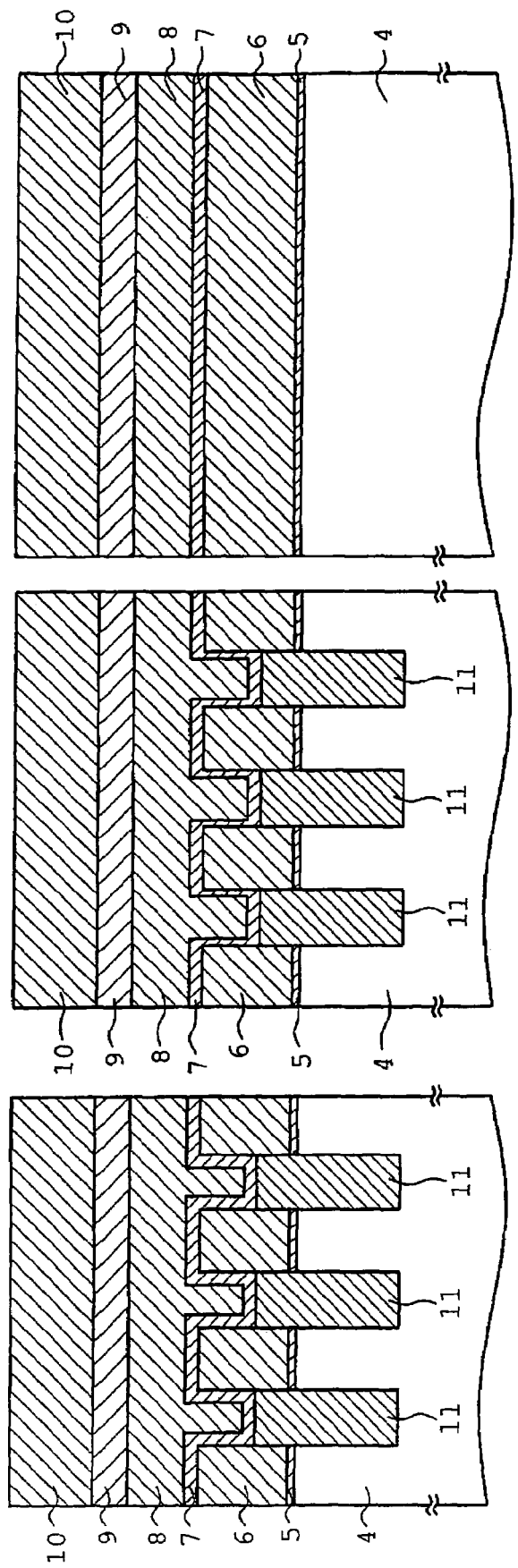

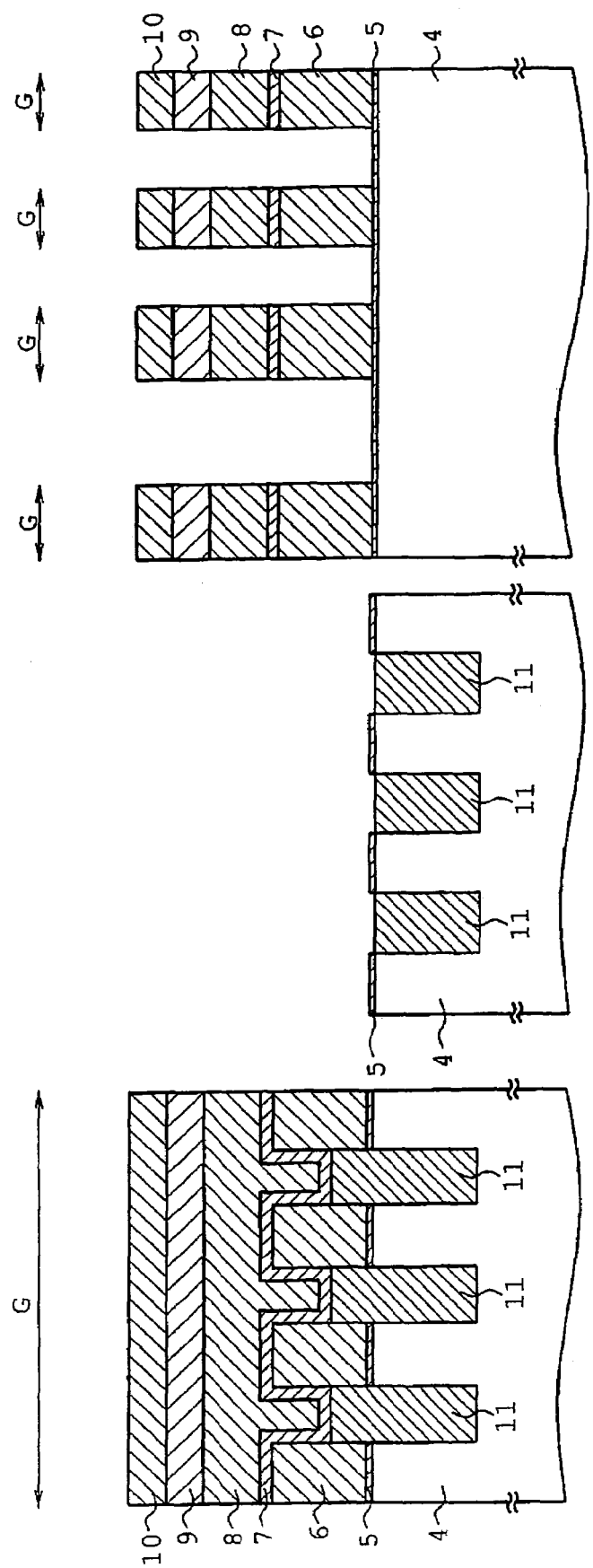

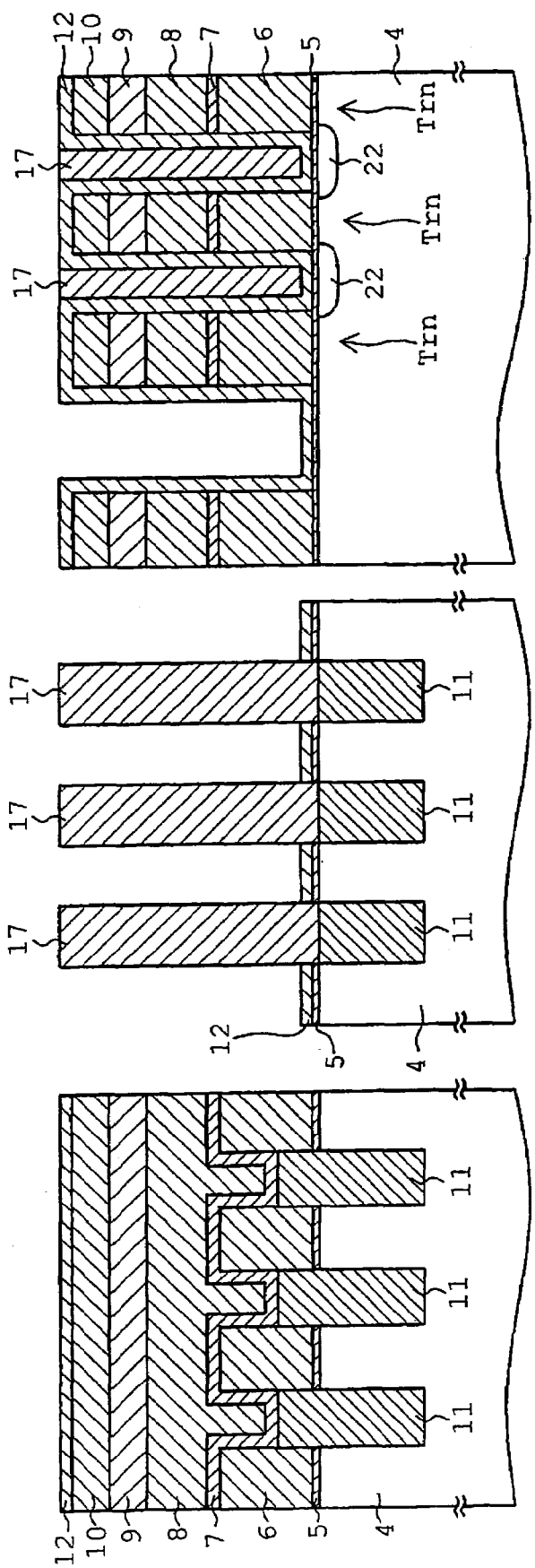

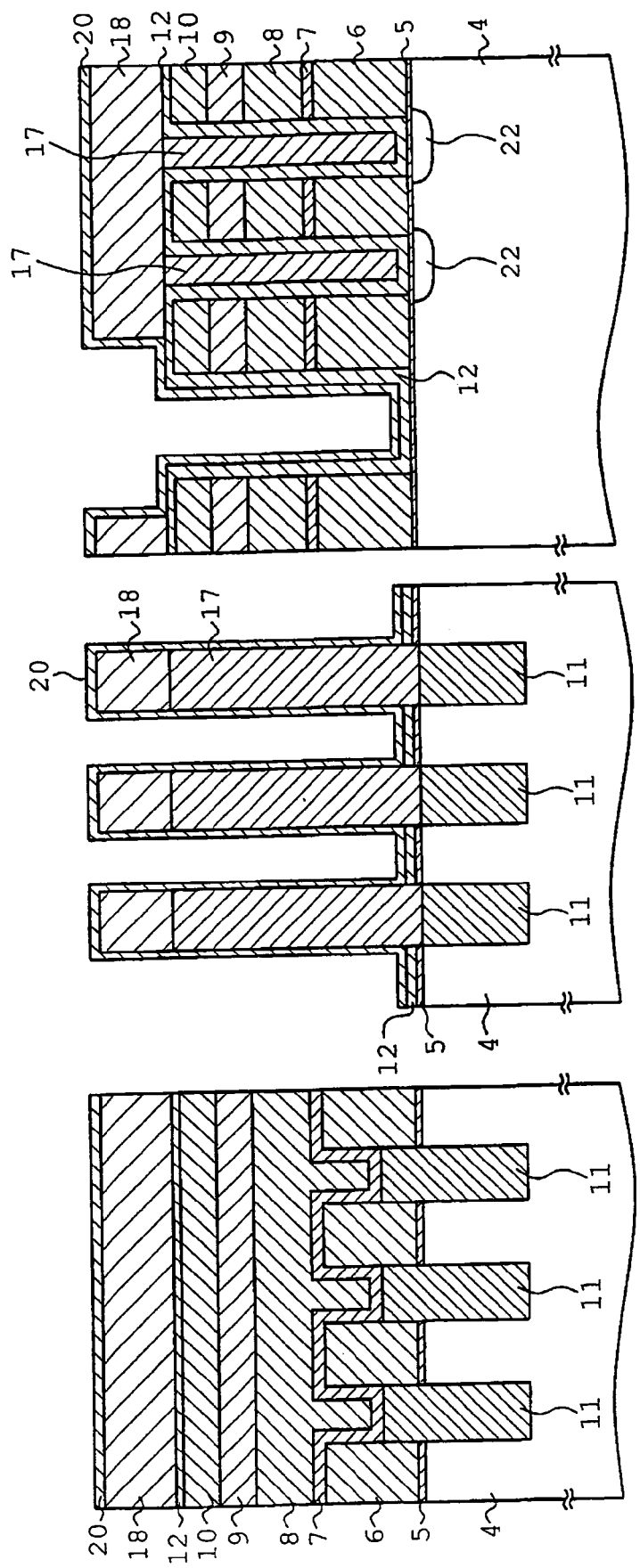

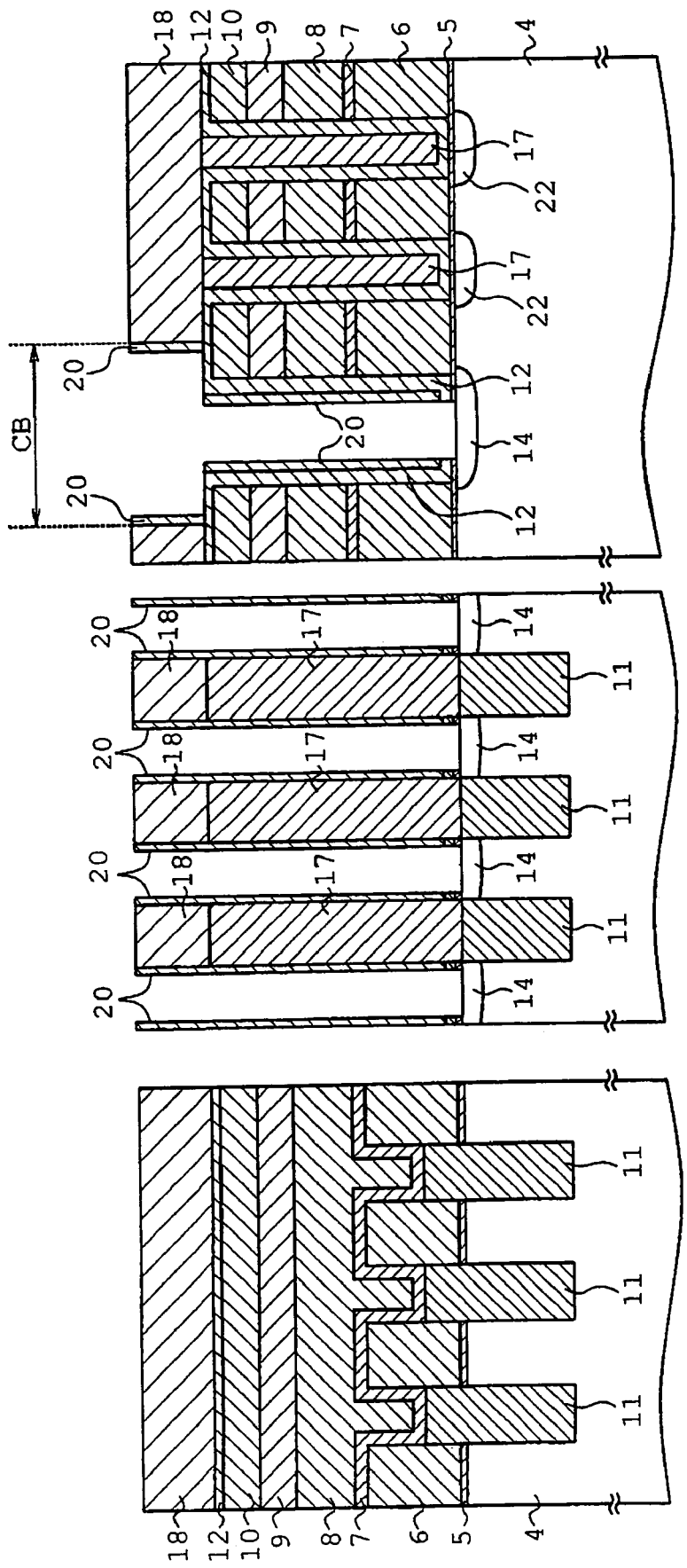

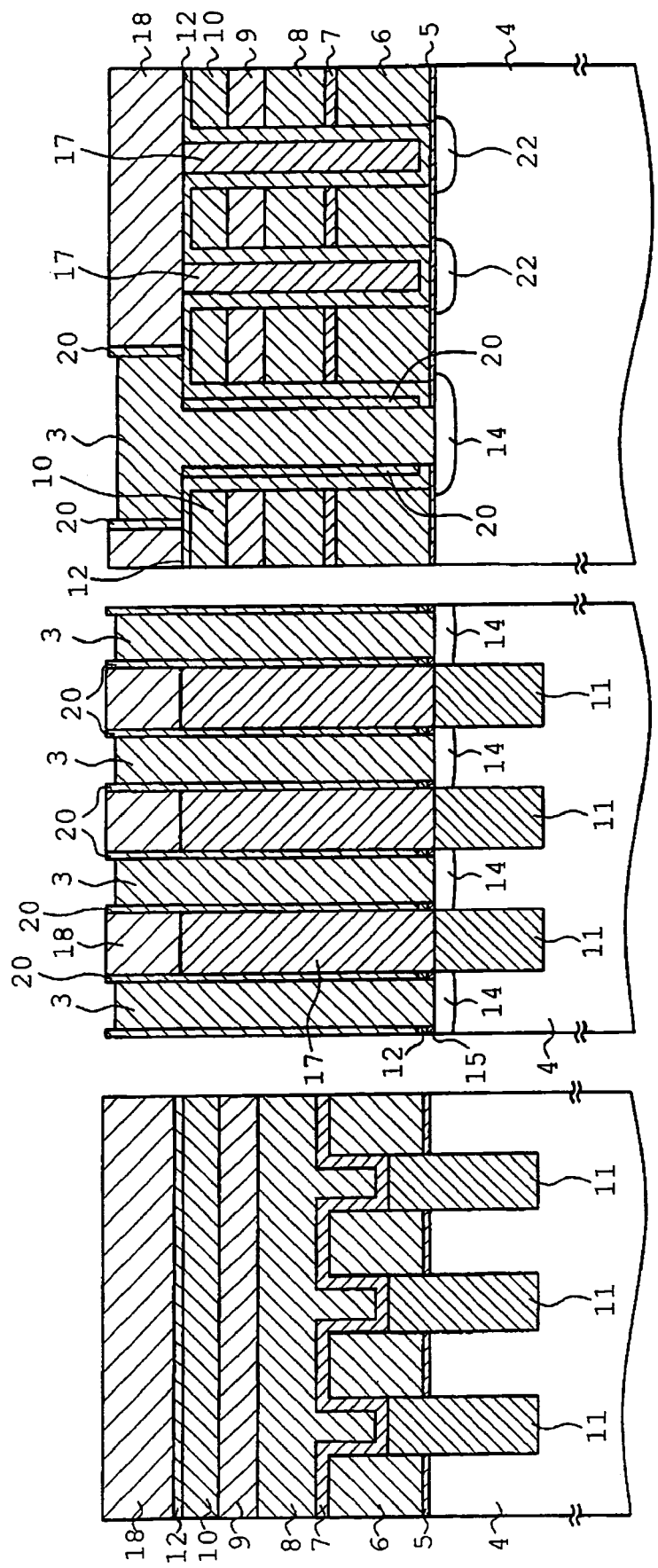

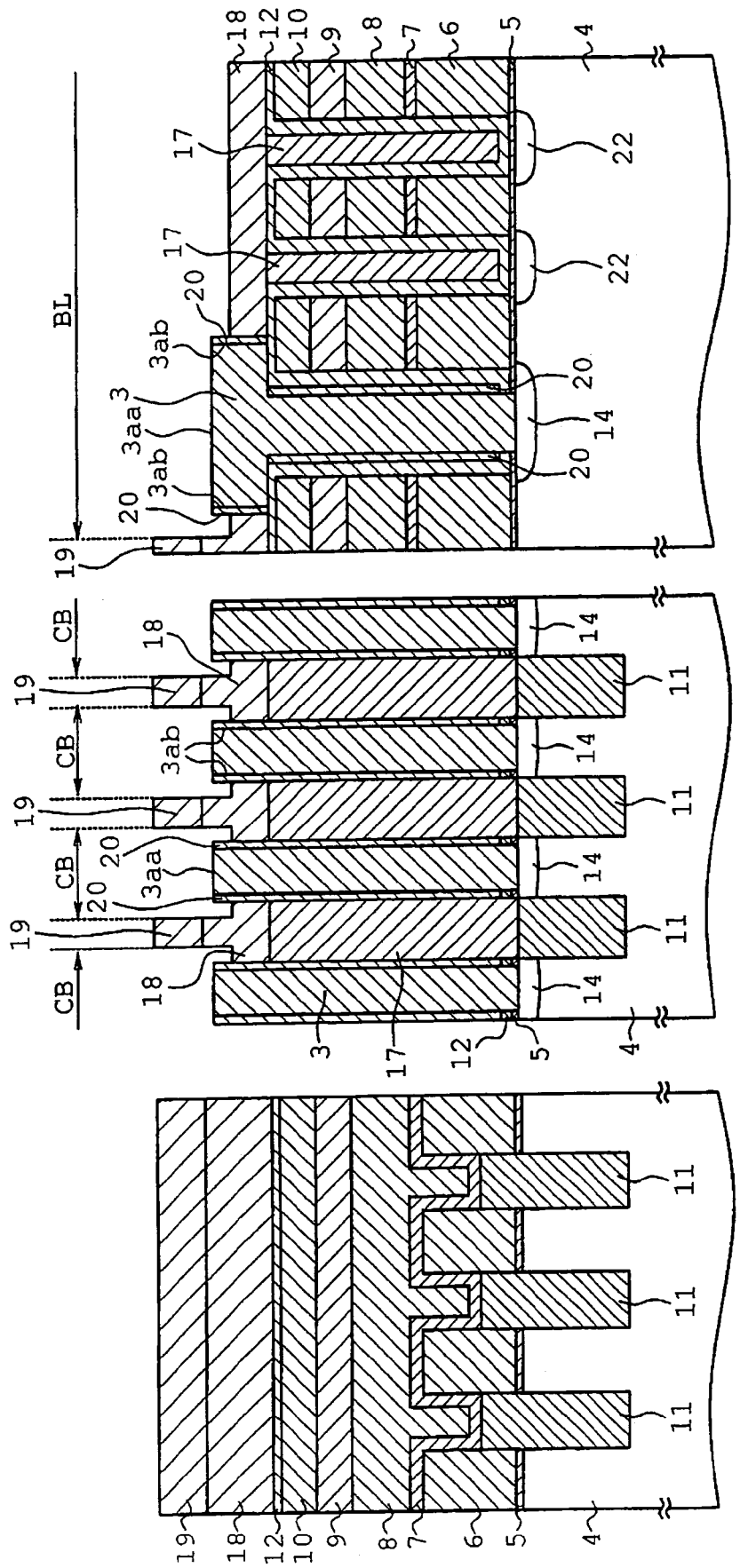

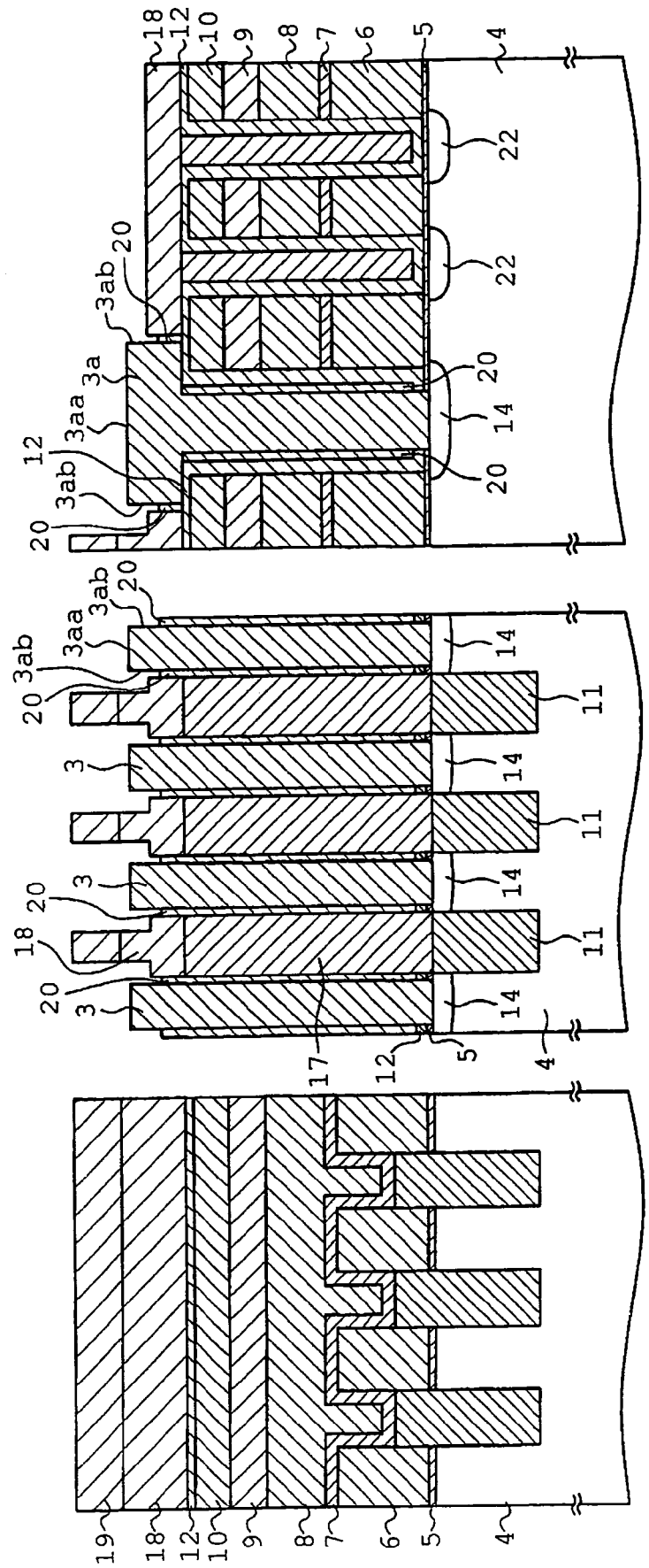

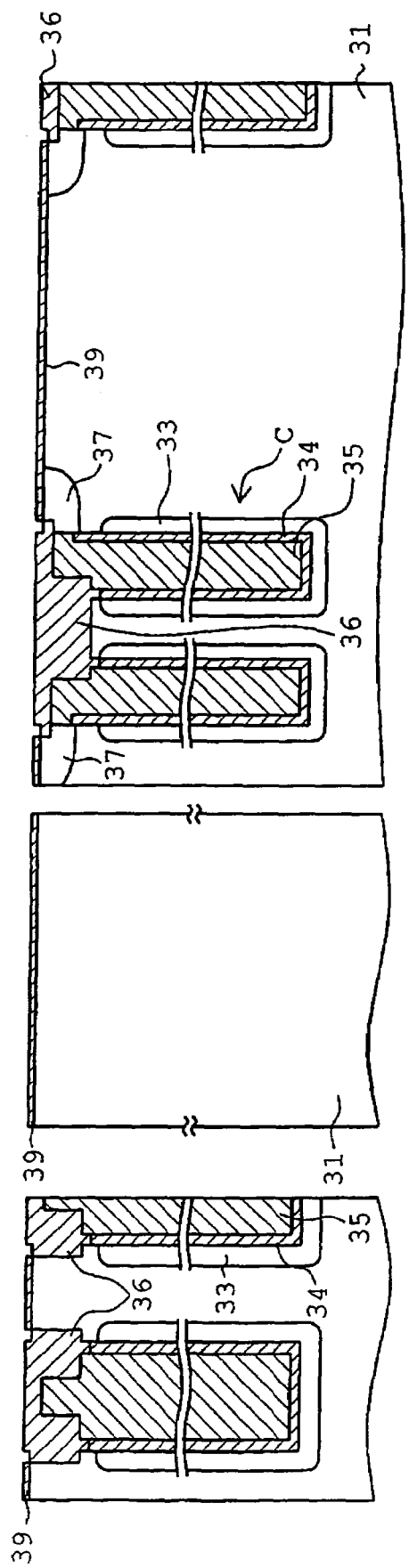

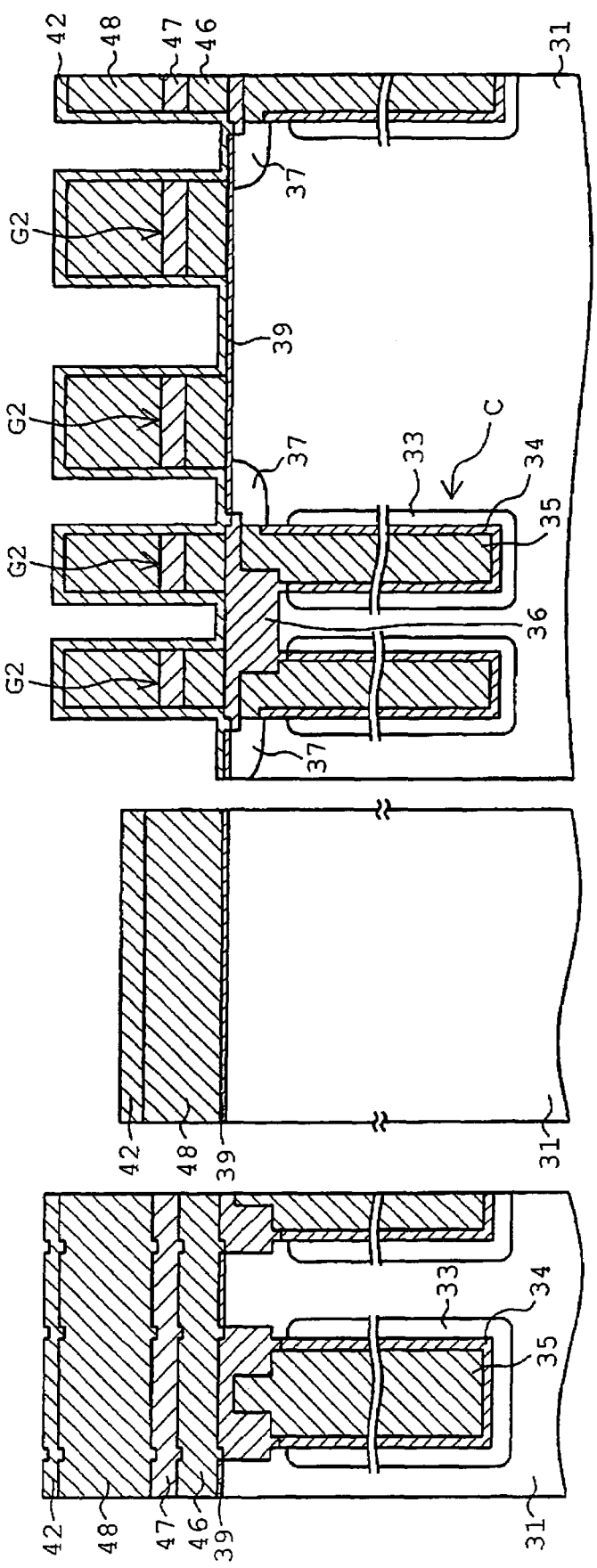

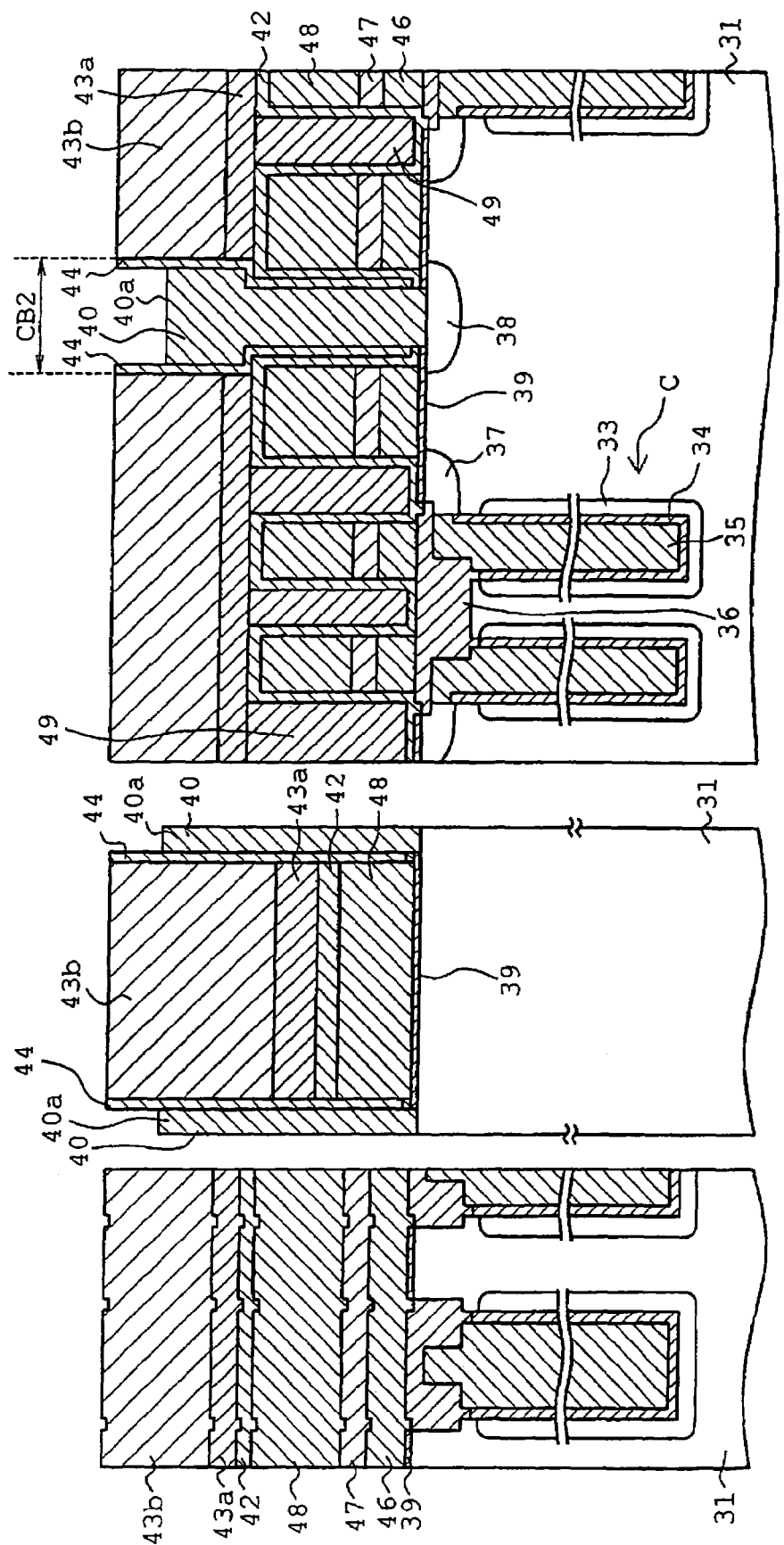

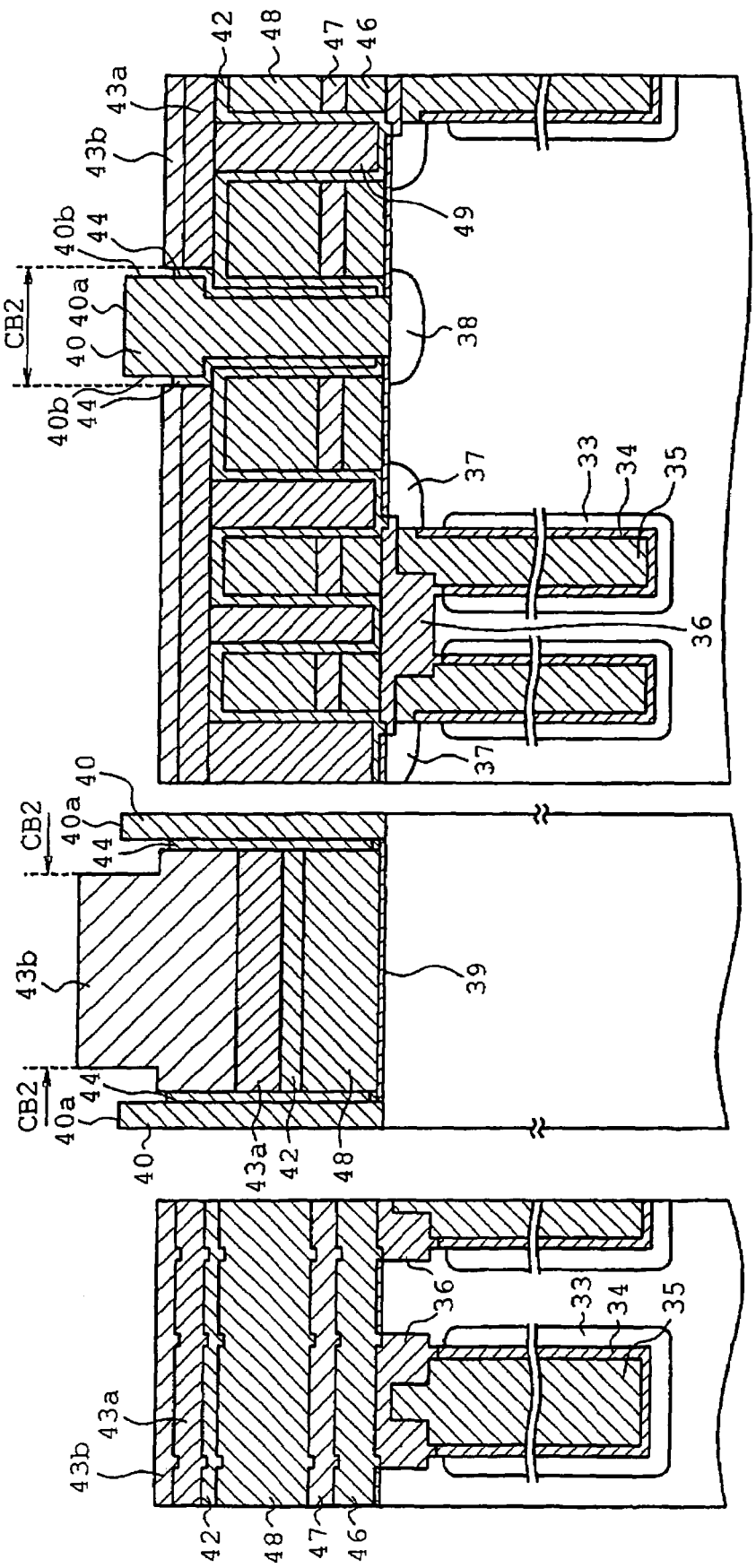

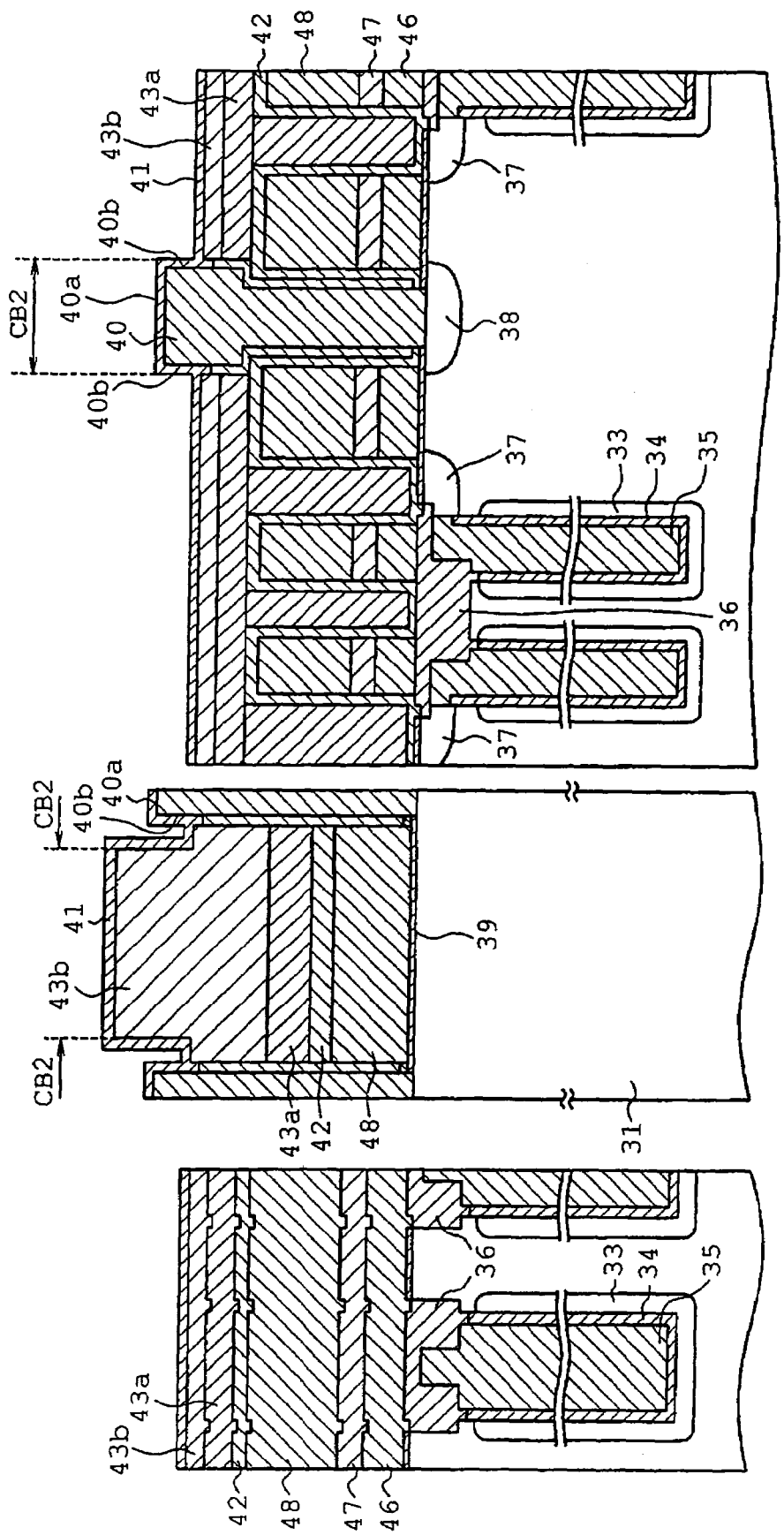

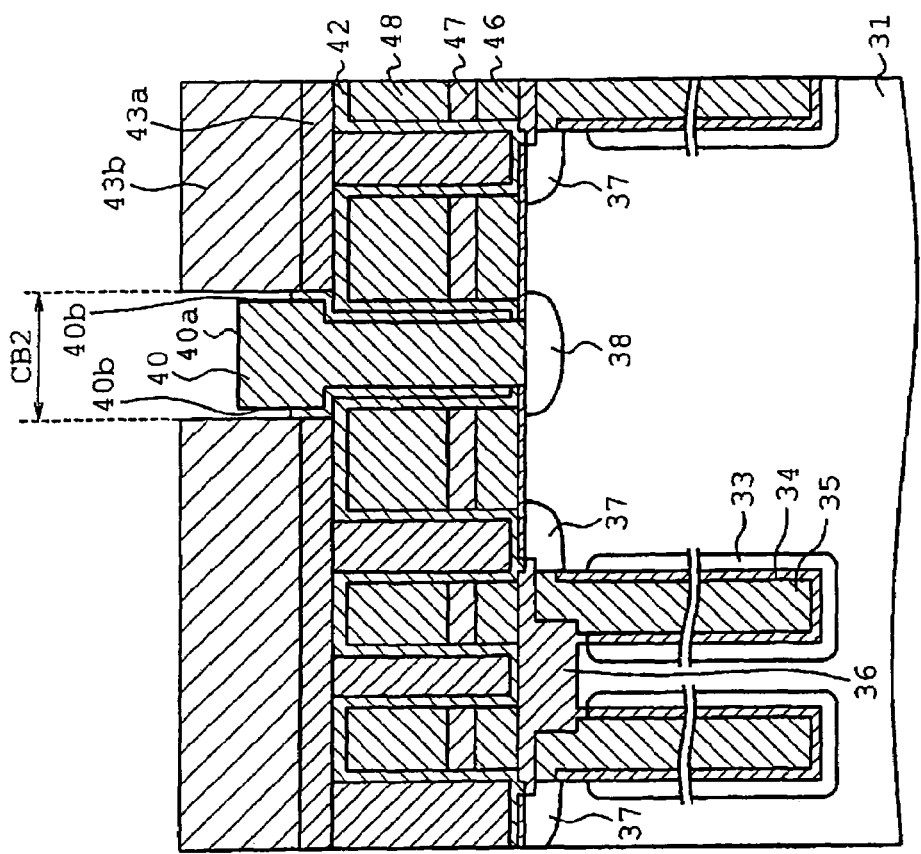
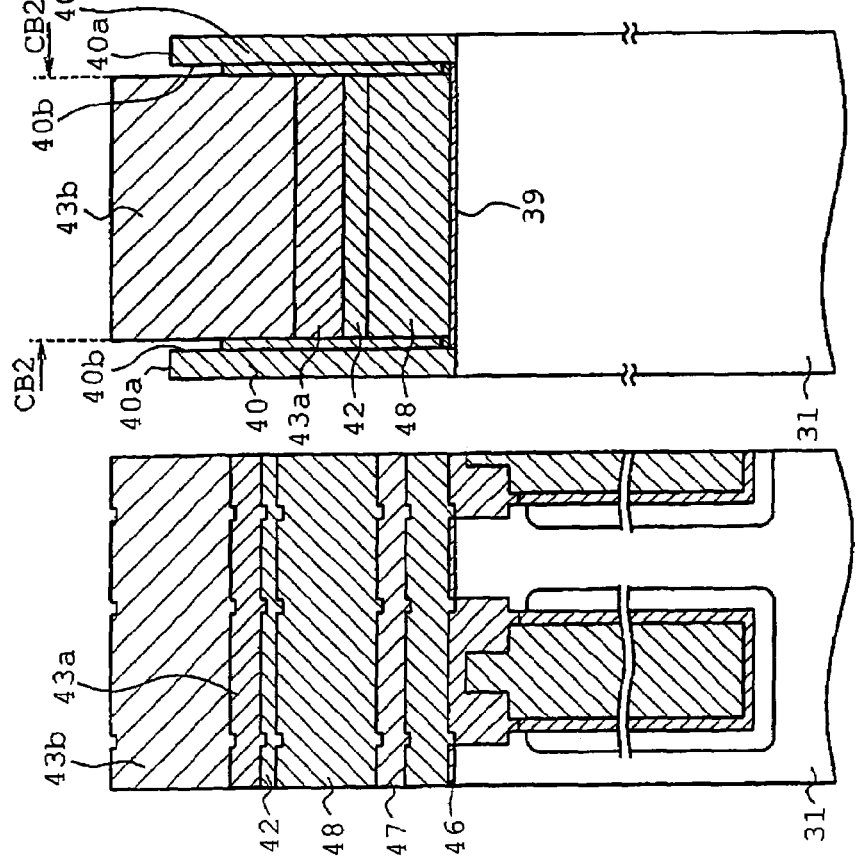
FIG. 32A    FIG. 32B    FIG. 32C

SEMICONDUCTOR DEVICE AND METHOD OF FABRICATING THE SAME

CROSS-REFERENCE TO RELATED APPLICATION

This application claims the benefit of priority form Japanese patent application No. 2004-107154, filed Mar. 31, 2004, the content of which is incorporated herein by reference.

BACKGROUND OF THE INVENTION

1. Field of the Invention

The present invention relates to a semiconductor device with a connected wiring layer structure electrically connecting upper and lower conductive layers to each other and a method of fabricating the same.

2. Description of the Related Art

With recent reduction in design rules, an insulating film serving as a spacer is sometimes provided on an outer periphery of a connected wiring layer in order to prevent electrical contact, short or electrical interaction between wiring layers adjacent to each other. More specifically, for example, JP-A-H06-310612 discloses a peripheral structure of a connected wiring layer connecting one wiring layer to another wiring layer. In the disclosed technique, an insulating film is provided around a wiring layer (corresponding to a connecting-wiring layer). The insulating film prevents contact between wiring layers or a wiring layer and a semiconductor substrate. The insulating film further suppresses reduction in the reliability due to corrosion. Since the insulating film is formed by chemical vapor deposition (CVD), it can be applied to the sides and the back as well as the upper side of the wiring layer, thereby composing an effective insulating structure.

JP-A-2002-198421 discloses the structure of a connected wiring layer connecting one wiring layer to another wiring layer. In the disclosed technique, an insulating film is selectively retreated relative to buried interconnection connecting conductor layers so that surfaces of the conductor layers are exposed, whereby a contact area is increased.

However, when an insulating film is formed as a spacer on the outer periphery of the wiring layer at a step and an upper conductive layer is formed at a subsequent step, the upper conductive layer can be brought into contact only with an upper surface of the connected wiring layer.

The design rules have recently been scaled down further and accordingly, a contact area cannot be increased when the upper conductive layer is brought into contact only with an upper surface of the connected wiring layer. As a result, contact resistance cannot be lowered. Furthermore, even if the technique disclosed in JP-A-2002-198421 is applied, the insulating film cannot sufficiently show its function of a spacer depending on the location to which it is retreated, although a contact area can be increased between the connected wiring layer and the upper conductive layer.

BRIEF SUMMARY OF THE INVENTION

Therefore, an object of the present invention is to provide a semiconductor device in which even when a spacer is provided on the sidewall of the connected wiring layer connecting the upper and lower conductive layers to each other, the contact area between the upper conductive layer and the connected wiring layer and the resistance of the contact portion can be lowered while the spacer is allowed to exhibit the function thereof.

In one embodiment the present invention provides a semiconductor device comprising a semiconductor substrate including a first upper surface having an active area extending in a first direction, a gate insulating film formed on the active area, a pair of gate electrodes having respective first side surfaces and formed on the gate insulating film, each gate electrode including a conductive portion and a first insulating film formed on the conductive portion, a first silicon oxide film having second side surfaces opposed to each other and formed above the gate electrodes, a plurality of bit lines formed on the first silicon oxide film and extending in the first direction, each bit line including a lower surface having a recess, a contact plug located between the gate electrodes so as to electrically connect one of the bit lines and the active area and including a first portion having a third side surface interposed between the gate electrodes, a second portion having a fourth side surface located between the opposed second side surfaces of the first silicon oxide film and a third portion having an upper surface and fifth side surface embedded in each recess of the bit line, a first silicon nitride layer located between the third side surface of the first portion of the contact plug and the first side surface of the gate electrode, a second silicon nitride layer located between the fourth side surface of the second portion of the contact plug and the second side surfaces of the first silicon oxide film, and a second silicon oxide film formed on the first silicon oxide film, wherein the entire upper surface and fifth side surface of the third portion of the contact plug directly contacts with an inner surface of each recess.

The invention also provides a method of fabricating a semiconductor device comprising forming a gate insulating film on a semiconductor substrate, forming a plurality of gate electrodes in a gate electrode forming region on the gate insulating film, forming a gate electrode isolation insulating film so that the gate electrode isolation insulating film covers the gate electrodes, forming a first insulating film on the gate electrode isolation insulating film except for bit line contact forming regions provided between the gate electrodes adjacent to each other, isotropically forming a second insulating film within the bit line contact forming region, removing the gate electrode isolation insulating film, second insulating film and gate insulating film all formed right over the lower conductive layer in the bit line contact forming region, forming a connected wiring layer inside the second insulating film so that the connected wiring layer is in contact with the lower conductive layer in the bit line contact forming region and the connected wiring layer has an upper surface extending over the gate electrode isolation insulating film, removing the first insulating film so that an upper side of the first insulating film is located lower that the upper surface of the connected wiring layer, removing the second insulating film formed on an upper side part of the connected wiring layer from the upper surface of the connected wiring layer to a lower part, and forming an upper conductive layer so that the upper conductive layer is in contact with the upper side part of the connected wiring layer in regions where the first and second insulating films have been removed.

BRIEF DESCRIPTION OF THE DRAWINGS

Other objects, features and advantages of the present invention will become clear upon reviewing the following description of the embodiment with reference to the accompanying drawings, in which:

FIGS. 4A to 4C typically illustrate a fabrication step (step 1);

FIGS. 6A to 6C typically illustrate a fabrication step (step 3);

FIGS. 7A to 7C typically illustrate a fabrication step (step 4);

FIGS. 8A to 8C typically illustrate a fabrication step (step 5);

FIGS. 10A to 10C typically illustrate a fabrication step (step 7);

FIGS. 11A to 11C typically illustrate a fabrication step (step 8);

FIGS. 12A to 12C typically illustrate a fabrication step (step 9);

FIGS. 14A to 14C typically illustrate a fabrication step (step 11);

FIGS. 15A to 15C typically illustrate a fabrication step (step 12);

FIGS. 23A to 23C typically illustrate a fabrication step (step 1);

FIGS. 25A to 25C typically illustrate a fabrication step (step 3);

FIGS. 28A to 28C typically illustrate a fabrication step (step 6);

FIGS. 30A to 30C typically illustrate a fabrication step (step 8);

FIGS. 31A to 31C typically illustrate a fabrication step (step 9); and

FIGS. 32A to 32C typically illustrate a fabrication step of a semiconductor device of a fourth embodiment in accordance with the present invention.

DETAILED DESCRIPTION OF THE INVENTION

Figure 1:
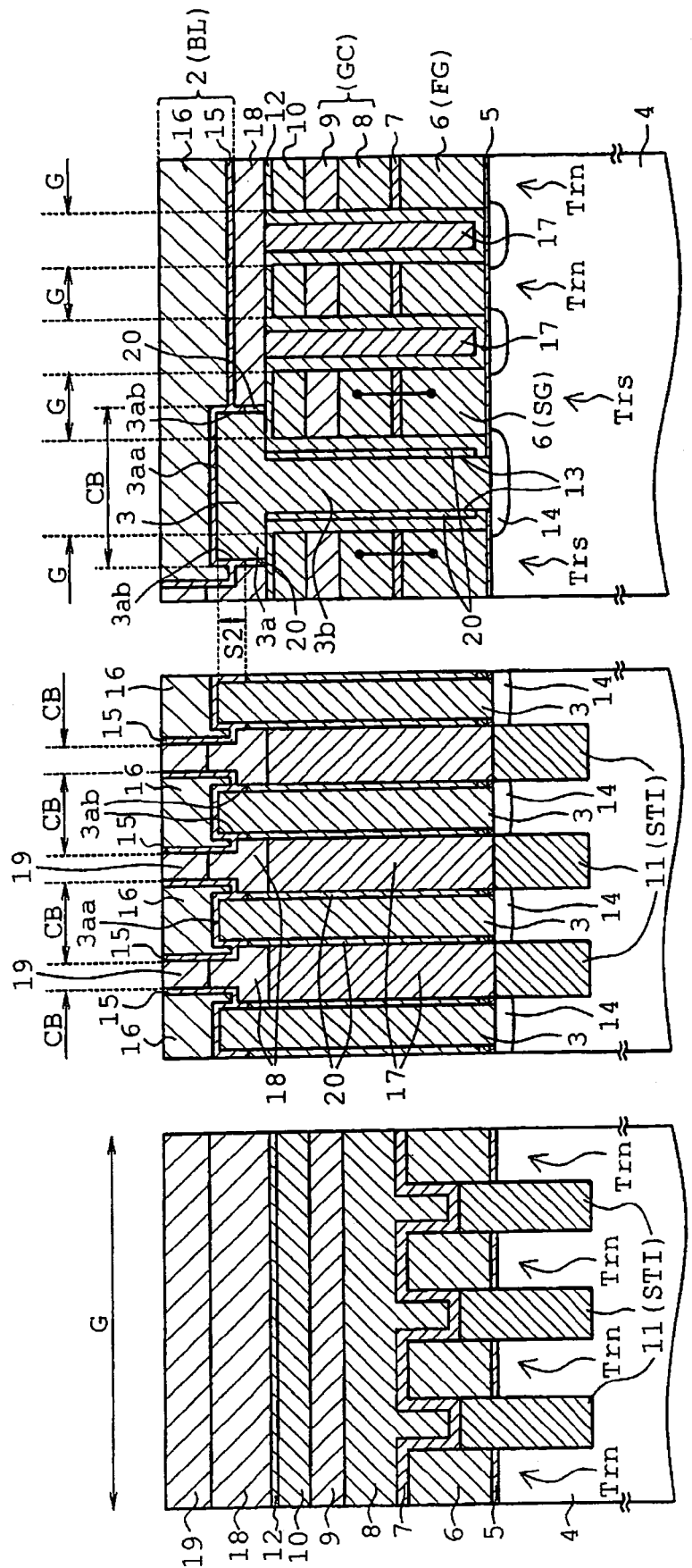
FIGS. 1A to 1C are schematic sectional views of a semiconductor device of a first embodiment in accordance with the present invention, the views being taken along lines 1A-1A, 1B-1B and 1C-1C in FIG. 3 respectively.
Figure 2:
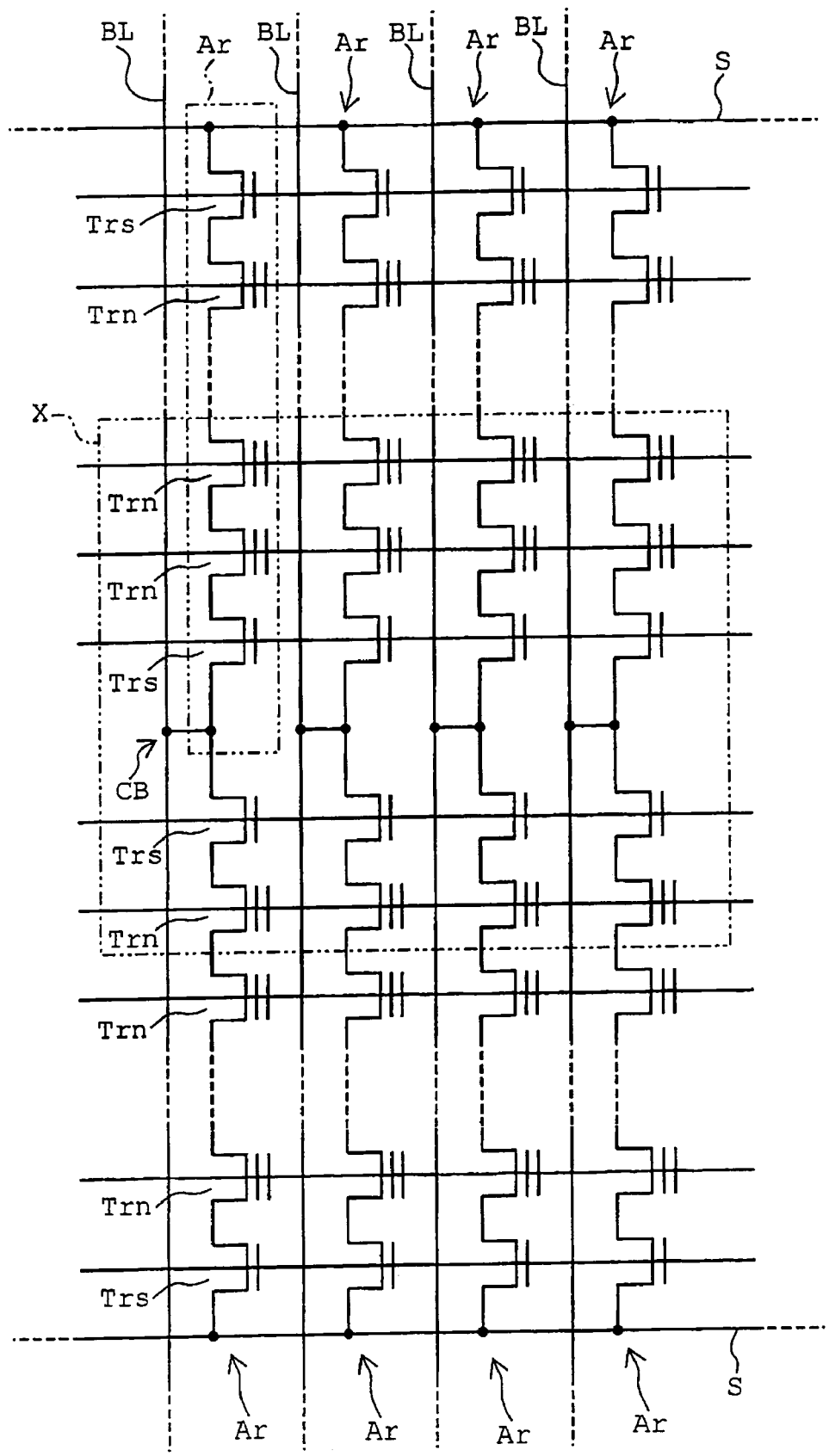
FIG. 2 schematically illustrates an electrical circuit arrangement of the semiconductor device.

Several embodiments of the present invention will be described with reference to the accompanying drawings. FIGS. 1A to 19 illustrate a first embodiment of the present invention. The invention is applied to a NAND flash memory (corresponding to a non-volatile memory, semiconductor storage and semiconductor device). The NAND flash memory is divided into a memory cell region and a peripheral circuit region. FIG. 2 shows an example of circuit in the memory cell region. Each memory cell array comprises selective gate transistors Trs connected to bit line BL side and source line S side respectively and a plurality of memory cell transistors Trn series-connected between the selective gate transistors Trs. The memory cell arrays Ar are vertically arranged so as to form the memory cell region as shown in FIG. 2. The selective gate transistor Trs of one of the memory cell arrays Ar has a gate electrode connected between gate electrodes of the selective gate transistors Trs of the adjacent memory cell array Ar. The memory cell transistor Trn of another memory cell array Ar has a gate electrode electrically connected between the gate electrodes of the memory cell transistors Trn of the adjacent memory cell array Ar, thereby serving as a word line.

Figure 3:
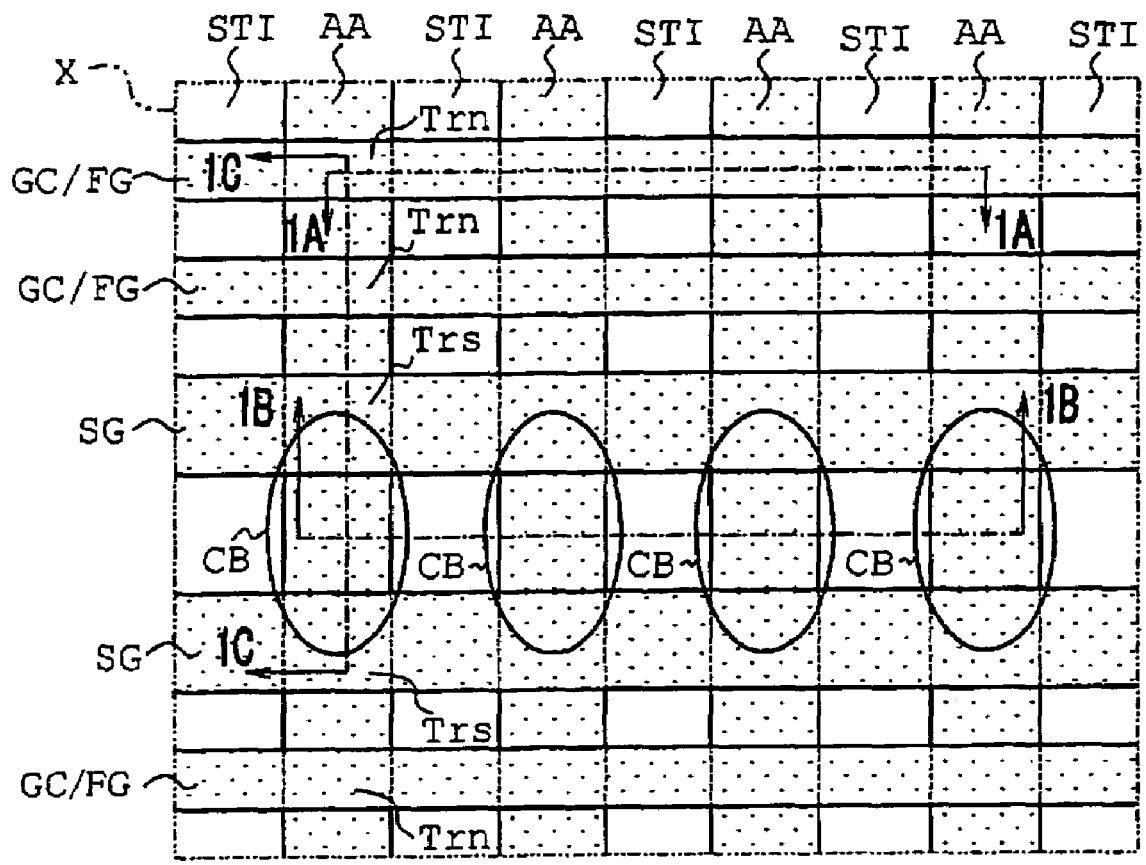
FIG. 3 is a plan view of the semiconductor device.

Referring to FIG. 3, part (region X in FIG. 2) of schematic arrangement of the memory cell arrays in the aforementioned circuit arrangement is shown. In FIG. 3, reference symbol GC designates wiring of the control gate electrode. Reference symbol FG designates a floating gate electrode. Reference symbol SG designates wiring of a selective gate electrode. Reference symbol CB designates bit-line contact forming region. Reference symbol AA designates an active area. Reference symbol STI designates an element isolation region.

FIGS. 1A to 1C are schematic sectional views of the semiconductor device taken along lines 1A-1A, 1B-1B and 1C-1C in FIG. 3 respectively. The embodiment is characterized by connection between an upper conductive layer 2 (corresponding to bit line BL) and a connected wiring layer (corresponding to a third polycrystalline silicon layer 3 which will be described later). Accordingly, the connection will be described in detail as follows.

In a gate electrode forming region G in each of the transistors Trs and Trn is deposited a silicon oxide film 5, first polycrystalline silicon layer 6, oxide nitride oxide (ONO) film 7, second polycrystalline silicon layer 8, tungsten silicide (WSi) layer 9 and first silicon nitride film 10 in this order from bottom. The first and second polycrystalline silicon layers 6 and 8 located in the selective gate forming region G are electrically connected to each other outside the region G. This connecting manner is not shown. Although the region G is formed on a p-type silicon semiconductor substrate, it may be formed in a powell region, instead. Further, the region G may be formed on a reverse-conduction type silicon semiconductor substrate.

The silicon oxide film 5 has a film thickness of 8 nm, for example and serves as a gate insulating film of each of the transistors Trs and Trn. The first polycrystalline silicon layer 6 comprises a polycrystalline silicon doped with impurity and has a film thickness of 160 nm, for example. The layer 6 serves as a floating gate FG of each transistor Trn. The ONO film 7 is also formed on the sidewalls of the first polycrystalline silicon layer 6 as well as on the upper surface of the layer. The ONO film 7 is formed so as to cover the first polycrystalline silicon layer 6 and a second silicon oxide film 11 serving as shallow trench isolation (STI). The ONO film 7 has a film thickness of 17 nm (5 nm oxide, 7 nm SiN and 5 nm oxide), for example. The ONO film 7 is provided for maintaining, at a high resistance value each of the first and second polycrystalline silicon layers 6 and 8 (floating gate and control gate electrodes FG and GC) in the gate electrode forming region G of each transistor Trn.

The second polycrystalline silicon layer 8 is formed of a polycrystalline silicon doped with impurity and has a film thickness of 100 nm, for example. In the gate electrode forming region G of each transistor Trn, the second polycrystalline silicon layer 8 serves as the control gate electrode GC together with a tungsten silicide layer 9. In the gate electrode forming region of each transistor Trs, the second polycrystalline silicon layer 8 serves as the selective gate electrode SG together with a tungsten silicide layer 9, thereby being formed as a word line. The tungsten silicide layer 9 has a film thickness of 90 nm, for example. Further, a first silicon nitride film 10 serves as an insulating film.

A second silicon nitride film 12 is formed so as to cover the layers 6 to 10 formed in the gate electrode forming region G of each of the transistors Trs and Trn. The second silicon nitride film 12 electrically insulates each of the gate electrode forming regions G of the adjacent transistors Trs and Trn from the other, thereby serving as a gate electrode isolation insulating film.

A bit line contact forming region CB is provided between the gate electrode forming regions G of the transistors Trs adjacent to each other (or between the selective gates SG adjacent to each other), as shown in FIGS. 1B, 1C and 3.

A hole 13 is formed in the bit line contact forming region CB. A third polycrystalline silicon layer 3 is formed in the hole 13. The third polycrystalline silicon layer 3 is interposed between the second silicon nitride films 12 covering the layers 6 to 10 composing the transistors Trs, as shown in FIG. 1C. The third polycrystalline silicon layer 3 includes a vertically elongate piece 3b (corresponding to a lower wiring portion) having the shape of a vertically elongate elliptic cylinder and an upper disc 3a (corresponding to an upper wiring portion). As a result, the third polycrystalline silicon layer 3 has a generally T-shaped longitudinal section. The third polycrystalline silicon layer 3 electrically connects a diffusion layer 14 (corresponding to a lower conductive layer) to a titan layer 15 composing the upper conductive layer 2.

The upper disc 3a extends horizontally to the upper surface of the second silicon nitride film 12 of the gate electrode forming region G of each transistor Trs, as shown in FIG. 1C. Furthermore, as shown in FIG. 1B, a second silicon oxide film 17, third silicon oxide film 18 (corresponding to a first insulating film) and fourth silicon oxide film 19 are formed between adjacent bit line contact forming regions CB. These silicon oxide films 17 to 19 are provided for electrically insulating the adjacent third polycrystalline silicon layer 3.

A third silicon nitride film 20 is formed on the outer periphery of the vertically elongate piece 3b of the third polycrystalline silicon layer 3, as shown in FIGS. 1B and 1C. The third silicon nitride film 20 is located between the third polycrystalline silicon layer 3 and the second and third silicon oxide films 17 and 18 and formed on the sidewalls of the third polycrystalline silicon layer 3 into a vertically elongate shape, as shown in FIG. 1B. The third silicon nitride film 20 serves as a spacer reinforcing an insulating function between the third polycrystalline silicon layers 3 adjacent to each other.

The third silicon nitride film 20 (corresponding to a second insulating film) is formed on the lower outer periphery of the upper disc 3a of the third polycrystalline silicon layers 3. The third silicon nitride film 20 also serves as a spacer between the third polycrystalline silicon layers 3 adjacent to each other as well as the aforesaid silicon nitride film.

The second silicon oxide film 17 is formed in between the gate electrode forming regions G of the transistors Trn and Trs composing each memory cell array. The second silicon oxide film 17 is provided for improving the electrically insulating function between the gate electrode forming regions G of the transistors Trn and Trs. The second silicon oxide film 17 is formed so as to be co-planar with the upper surface of the second silicon nitride film 12.

The third silicon oxide film 18 is formed over the upper surfaces of the second silicon nitride and oxide films 12 and 17 except the bit line contact forming region CB. The third silicon oxide film 18 is located on one side of the third polycrystalline silicon layer 3, extending horizontally into the shape of a thin plate. The third silicon oxide film 18 is provided for maintaining the insulating performance between various gate electrodes (control gate electrode GC, selective gate electrode SG, floating gate electrode FG) and tungsten silicide layer 9, and the bit line BL (tungsten layer 16 and titan layer 15).

The tungsten (W) layer 16 and the titan (Ti) layer 15 each serving as an upper conductive layer are formed so as to be in contact with an upper surface 3aa and upper side face 3ab of the upper disc 3a of the third polycrystalline silicon layer 3, as shown in FIGS. 1B and 1C. Each of the titan and tungsten layers 16 and 15 serves as a bit line BL. The titan layer 15 has a film thickness of 45 nm, for example. The titan layer 15 is formed so as to be in contact with the upper surface 3aa, upper side face 3ab and the upper part of the third silicon nitride film 20. The titan layer 15 is further formed on the upper side of the third silicon nitride film 20 and has a film thickness of 45 nm. The titan layer 15 is formed so that the third silicon oxide film 18 and the tungsten layer 16 are kept noncontact with each other. The tungsten layer 16 has a film thickness of 400 nm, for example, and includes a lower part covered by the titan layer 15.

According to the first embodiment, the sidewall of the upper disc 3a of the third polycrystalline silicon layer 3 is not entirely covered with the third silicon nitride film 20. The titan layer 15 is in contact with the third polycrystalline silicon layer 3 at the upper surface 3aa and upper side face 3ab of the upper disc 3a of the third polycrystalline silicon layer 3. Consequently, the contact area between the third polycrystalline silicon layer 3 and titan layer 15 can be increased (see contact area S2 in FIGS. 1B and 1C).

The fabricating method will now be described in detail with additional reference to FIGS. 4A to 19. FIGS. 4A to 16A all suffixed with "A" are longitudinally sectional views taken along line 1A-1A in FIG. 3. FIGS. 4B to 16B all suffixed with "B" are longitudinally sectional views taken along line 1B-1B in FIG. 3. FIGS. 4C to 16C all suffixed with "C" are longitudinally sectional views taken along line 1C-1C in FIG. 3. One or more of the fabrication steps in the following description may be eliminated or one or more new fabrication steps may be added if the semiconductor device of the invention can be fabricated.

1. Steps of forming the structure as shown in FIGS. 4A to 4C:

The silicon oxide film 5 with the film thickness of 8 nm, for example, is formed on the p-type silicon semiconductor substrate 4. The first polycrystalline silicon layer 6 doped with impurity is formed by the low pressure chemical vapor deposition (low pressure CVD) so as to have a film thickness of 160 nm, for example. The fourth silicon nitride film 21 is formed so as to have a film thickness of 70 nm, for example. Photoresist (not shown) is applied to the fourth silicon nitride film 21 so that a predetermined resist pattern is formed by the photolithography technique. The fourth silicon semiconductor substrate 21, first polycrystalline silicon layer 6, first silicon oxide film 5 and silicon semiconductor substrate 4 are simultaneously processed by the reactive ion etching (RIE) process with the resist pattern serving as a mask so that a predetermined depth is reached, whereby a trench T for forming the shallow trench isolation (STI) is formed. Thereafter, the photoresist is removed. Thus, the fourth silicon semiconductor substrate 21, first polycrystalline silicon layer 6, first silicon oxide film 5 and silicon semiconductor substrate 4 are formed as shown in FIGS. 4A to 4C.

Figures 5A, 5B, 5C:
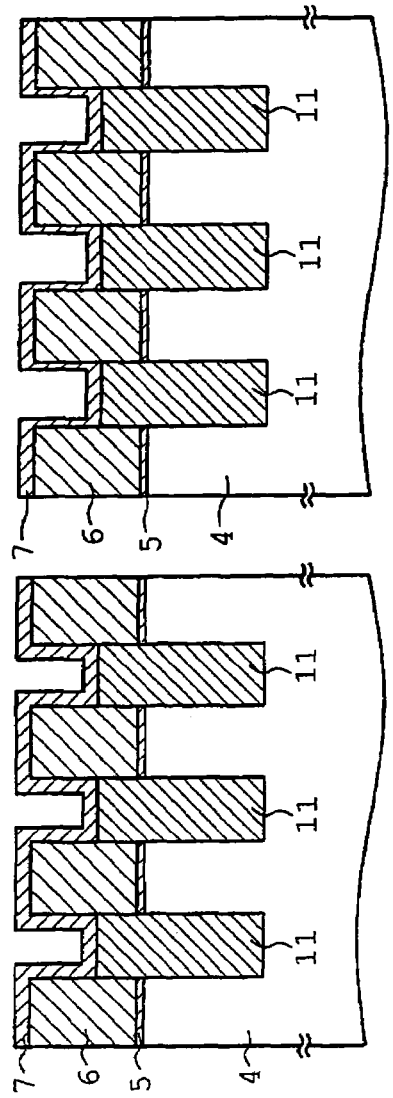
FIGS. 5A to 5C typically illustrate a fabrication step (step 2)

2. Steps of forming the structure as shown in FIGS. 5A to 5C:

After completion of the above-described forming step 1, the second silicon nitride film 11 is deposited by the high-density-plasma (HDP)-CVD process by the film thickness of 550 nm, for example, so as to be buried in the trench T. Thereafter, the second silicon nitride film 11 is flattened by the chemical mechanical polishing (CMP) so that the fourth silicon nitride film 21 is exposed and then heated in the nitric atmosphere to 900° C., for example. The fourth silicon nitride film 21 is removed at 150° C. by the phosphating, for example. Photoresist (not shown) is then applied and a predetermined resist pattern is formed by the photolithography technique. After removal of the photoresist, the ONO film 7 serving as the second gate insulating film is isotropically formed by the low pressure CVD so as to have a film thickness of 17 nm (oxide: 5 nm, SiN: 7 nm and oxide: 5 nm). Thus, the ONO film 7 is formed as shown in FIGS. 5A to 5C.

3. Steps of forming the structure as shown in FIGS. 6A to 6C:

After completion of the above-described forming step 2, heat is applied to the ONO film 7 in an oxidizing atmosphere. The second polycrystalline silicon layer 8 doped with impurity is formed on the ONO film 7 by the low pressure CVD so as to have a film thickness of 100 nm, for example. The tungsten silicide layer 9 is formed on the second polycrystalline silicon layer 8 by the sputtering process so as to have a film thickness of 90 nm, for example. The first silicon nitride film 10 is then formed by the low pressure CVD so as to have a film thickness of 300 nm, for example. Thus, the second polycrystalline silicon layer 8, tungsten silicide layer 9 and first silicon nitride film 10 are formed as shown in FIGS. 6A to 6C.

4. Steps of forming the structure as shown in FIGS. 7A to 7C:

After completion of the above-described forming step 3, photoresist (not shown) is applied to the first silicon nitride film 10 and formed into a predetermined resist pattern. The first silicon nitride film 10 is etched by the RIE process with the photoresist serving as a mask. The etching is applied to a region other than the gate electrode forming region G. After the photoresist has been removed by ashing, the tungsten silicide layer 9, second polycrystalline silicon layer 8, ONO film 7 and first polycrystalline silicon layer 6 are etched by the RIE process with the first silicon nitride film 10 serving as a mask (see FIGS. 7B and 7C).

In this case, the first silicon nitride film 10, tungsten silicide layer 9, second polycrystalline silicon layer 8, ONO film 7 and first polycrystalline silicon layer 6 are etched by the RIE process in the bit line contact forming region CB for connecting the bit line and the peripheral region. As a result, as shown in FIG. 7B, all the layers formed on the substrate 4 are removed except the silicon oxide film 5. Thus, the first silicon nitride film 10, tungsten silicide layer 9, second polycrystalline silicon layer 8, ONO film 7 and first polycrystalline silicon layer 6 are formed as shown in FIGS. 7A to 7C.

5. Steps of forming the structure as shown in FIGS. 8A to 8C:

After completion of the above-described forming step 4, a rapid thermal oxidation (RTO) process is executed at 1050° C., for example. The second silicon nitride film 12 is isotropically formed so as to have a film thickness of 20 nm, for example. Thereafter, the n-type impurity is implanted to the substrate 4 via the second silicon nitride film 12 and second silicon oxide film 17 both formed between the gate electrode forming regions G of the transistors Trn and Trs adjacent to each other, whereby the source/drain diffusion layers 22 of the transistors Trn and Trs are formed.

Subsequently, the second silicon oxide film 17 is formed on the silicon nitride film 12 formed between the gate electrode forming regions G of the transistors Trn and Trs, and the second silicon oxide film 17 is further formed in the upper part of the second silicon nitride film 12 formed between the gate electrode forming regions G of the transistors Trn. In this case, as shown in FIG. 8B, the second silicon oxide film 17 is formed. The second silicon oxide film 17 is provided for maintaining high resistance between the third polycrystalline silicon layers adjacent to each other.

Figures 9A, 9B, 9C:
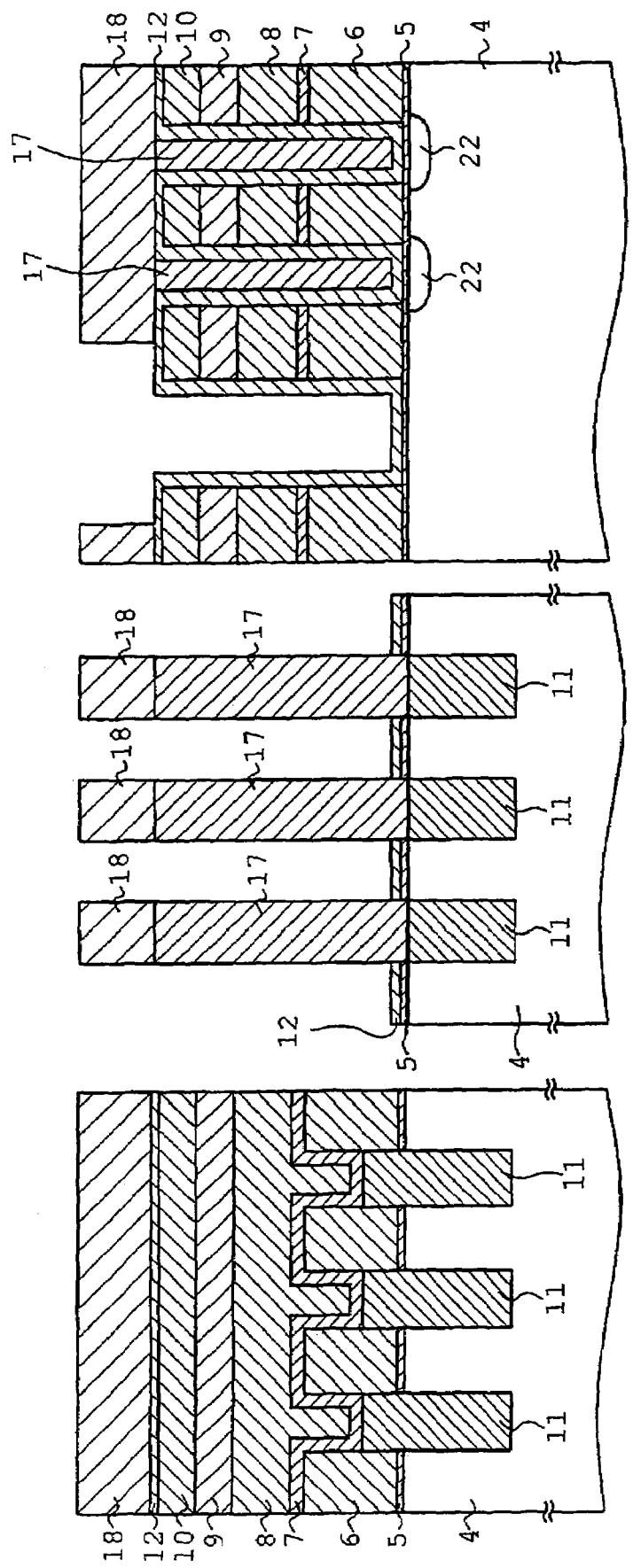
FIGS. 9A to 9C typically illustrate a fabrication step (step 6)

A reflow process is carried out for the second silicon oxide film 17 at 800° C. in an oxidizing atmosphere. The second silicon oxide film 17 is then flattened by the CMP process with the first and second silicon nitride films 10 and 12 serving as a stopper. Thereafter, the third silicon oxide film 18 is formed on the first and second silicon nitride films 10 and 12 and second silicon oxide film 17 by the plasma CVD process. Photoresist (not shown) is applied to the third silicon oxide film 18 and formed into a predetermined resist pattern by the photolithography technique, and the third silicon oxide film 18 is processed using the resist pattern. Thus, the third silicon oxide film 18 is formed as shown in FIGS. 9A to 9C.

After completion of the above-described forming step 5, the third silicon nitride film 20 is isotropically formed so as to have a film thickness of 10 nm, for example, as shown in FIGS. 10A to 10C. Furthermore, the dry-etching is carried out for the third silicon nitride film 20 thereby to remove the third silicon nitride film 20 formed on the third silicon oxide film 18, the third silicon nitride film 20 formed in the gate electrode forming region G of the transistor Trs, first and third silicon nitride films 12 and 20 formed right on the substrate 4, and first silicon oxide film 5 except for a part to be formed into a sidewall insulating film of the gate electrode forming region G, as shown in FIGS. 11A to 11C. As a result, the second and third silicon nitride films 12 and 20 remain on the sidewall at the bit line contact forming region CB side of the third silicon oxide film 18 and on the sidewall at the bit line contact forming region CB interposed between the gate electrode forming regions G of the transistors Trs.

Furthermore, the third polycrystalline silicon layer 3 is formed in the bit line contact forming region CB, and an upper part of the third polycrystalline silicon layer 3 is etched back by the chemical dry etching (CDE) process so that the height of the third polycrystalline silicon layer 3 is adjusted, as shown in FIGS. 12A to 12C. Thereafter, heat is applied to the third polycrystalline silicon layer 3 at 970° C. in a nitric atmosphere so that dopant is activated.

Figures 13A, 13B, 13C:
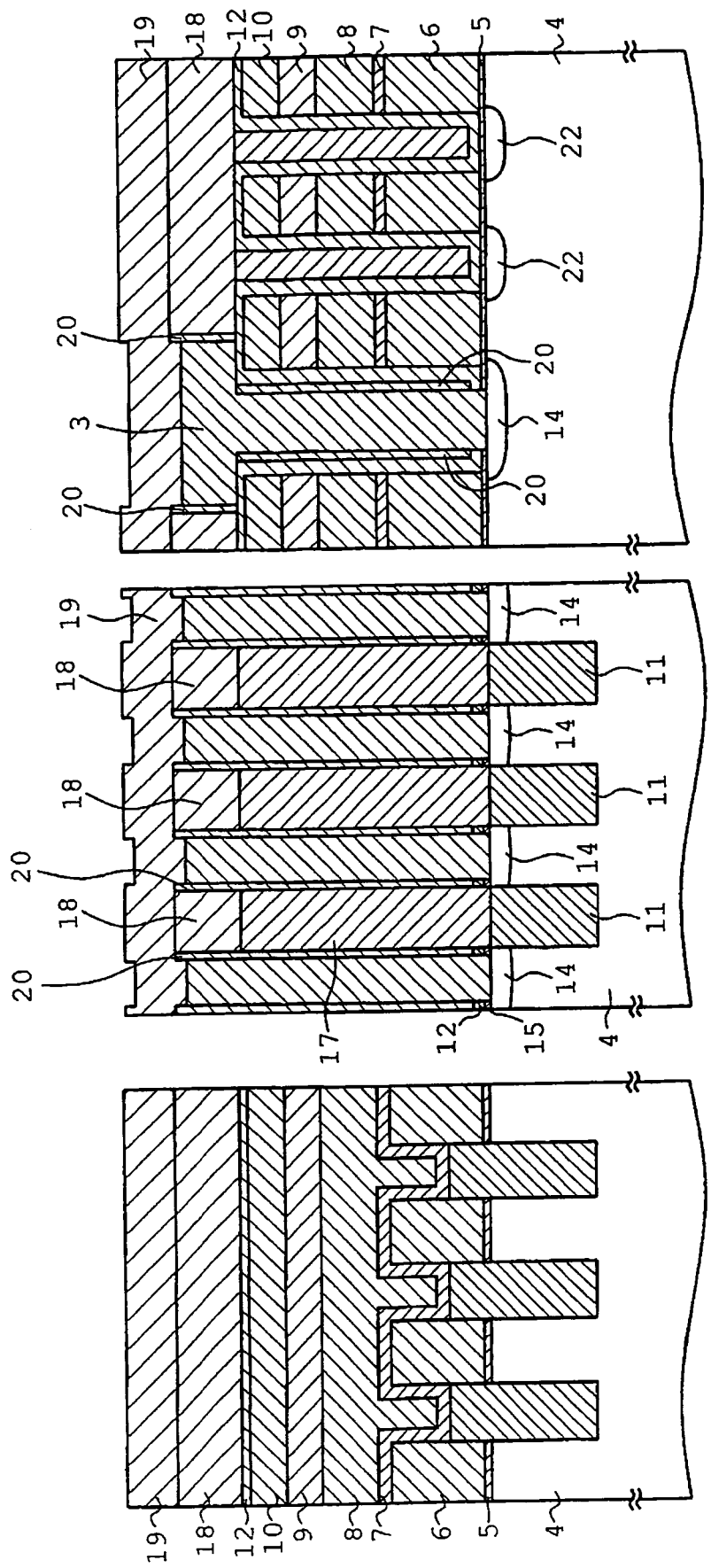
FIGS. 13A to 13C typically illustrate a fabrication step (step 10)

The fourth silicon oxide film 19 is formed on the third silicon oxide film 18, third silicon nitride film 20 and third polycrystalline silicon layer 3 by the plasma CVD process, whereby the thickness of the silicon oxide film is increased, as shown in FIGS. 13A to 13C. Thereafter, photoresist (not shown) is applied to the fourth silicon oxide film 19 and formed into a predetermined resist pattern. The third and fourth silicon oxide films 18 and 19 are etched back by the RIE process under the condition with higher selectivity with respect to polycrystalline silicon and silicon nitride films with the resist pattern serving as a mask, whereby a forming region for the bit line BL is secured. In this case, around the bit line contact forming region CB, the third silicon oxide film 18 is etched back until a portion lower than the upper surface 3aa of the upper disc 3a is reached. The silicon oxide film is removed from an upper portion of the upper disc 3a substantially simultaneously with the third and fourth silicon oxide films 18 and 19. However, the third silicon nitride film 20 remains adherent to the sidewall of the upper disc 3a.

Subsequently, the third silicon nitride film 20 is removed under the etching condition with higher selectivity with respect to silicon oxide film or polycrystalline silicon (for example, wet etching process such as phosphating at 150° C.) until a portion lower than the upper surface of the third silicon oxide film 18 and a portion higher than the upper surface of the second silicon nitride film 12 are reached. The third silicon nitride film 20 may be removed by the dry etching. More specifically, the third silicon nitride film 20 is removed from the upper sidewall of the third polycrystalline silicon layer 3. Thus, the structure is formed as shown in FIGS. 15A to 15C.

Figure 16C:
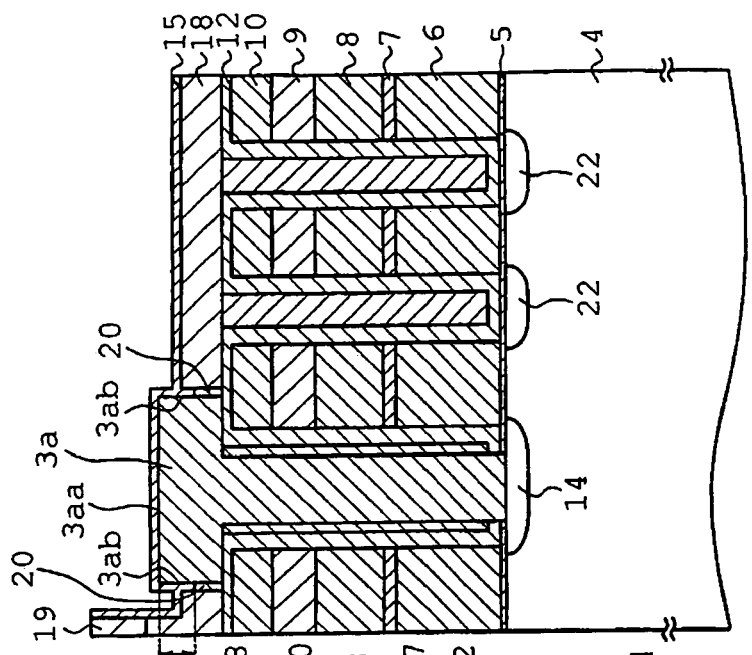
FIGS. 16A to 16C typically illustrate a fabrication step (step 13)
Figure 16B:
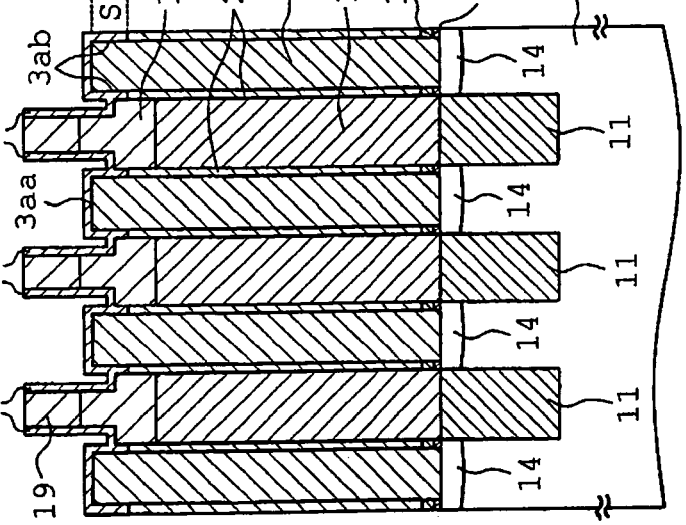
Figure 16A:
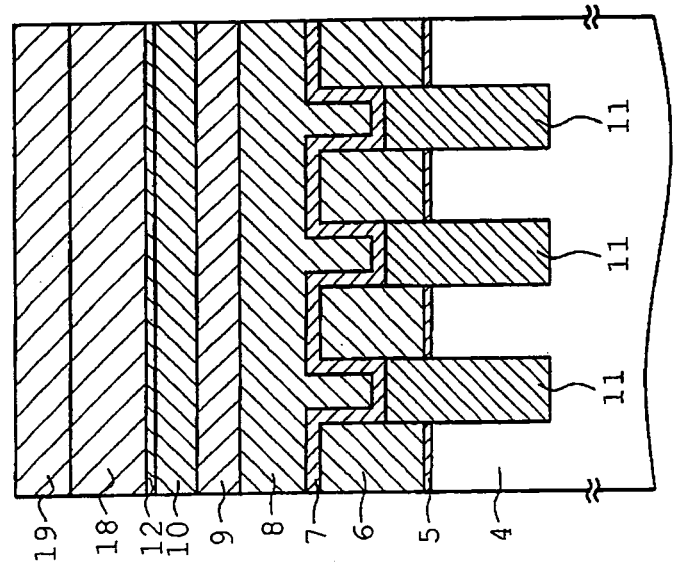

Subsequently, the titan layer 15 is isotropically formed by the PVD process so as to have a film thickness of 45 nm as shown in FIGS. 16A to 16C. Heat is applied to the titan layer 15 at 550° C. in a hydrogen-containing nitric atmosphere for 90 minutes. Furthermore, the tungsten (W) layer 16 is isotropically formed by the PVD process so as to have a film thickness of 400 nm as shown in FIGS. 1A to 1C. Thereafter, the titan and tungsten layers 15 and 16 are flattened by the CMP process until the fourth polycrystalline silicon oxide film 19 is exposed. The structure is then heat-treated at 400° C. in the hydrogen-containing nitric atmosphere for 30 minutes. Furthermore, a post-process is carried out so that the memory cell region of the NAND non-volatile memory can be formed.

For example, when the third silicon nitride film 20 is formed as a spacer on the outer peripheral sidewall of the upper disc 3a of the third polycrystalline silicon layer 3, only the upper surface 3aa of the upper disc 3a of the third polycrystalline silicon layer 3 is brought into contact with the titan layer 15. As a result, the contact portion unavoidably renders high resistant.

In view of the aforesaid problem, in the fabricating method of the embodiment, the third silicon oxide film 18 is formed on the upper portions of the second silicon nitride film 12 and second silicon oxide film 17 except for the bit line contact forming region CB. The second silicon nitride film 12 is isotropically formed as the spacer on the bit line contact forming region CB. The second and third silicon nitride films 12 and 20 located on the upper surface of the substrate 4 are removed. The third polycrystalline silicon layer 3 is formed in the bit line contact forming region CB so that the layer 3 is in contact with the source/drain diffusion layer 14 and so that the upper surface 3aa of the upper disc 3a is formed so as to be located higher than the second silicon nitride film 12. The third silicon oxide film 18 is removed so that an upper surface of the third silicon oxide film 18 is located lower than the upper surface 3aa of the layer 3. The third silicon nitride film 20 is removed until a portion horizontally lower than the upper surface 3aa is reached. The titan layer 15 is formed on the upper side face 3ab of the third polycrystalline silicon layer 3. Consequently, the contact area can be increased between the third polycrystalline silicon layer 3 and the titan layer 15, whereupon the resistance in the contact portion can be lowered.

Figure 17A:
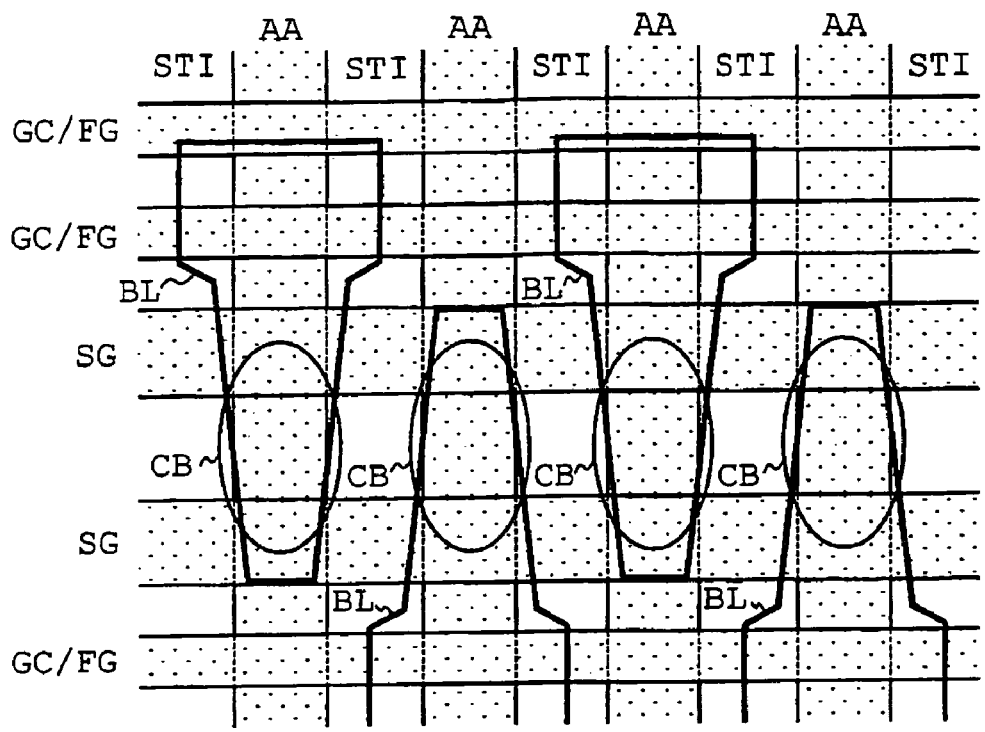
FIG. 17A is a typical plan view of the bit line and bit line contact both connected to each other.
Figure 17B:
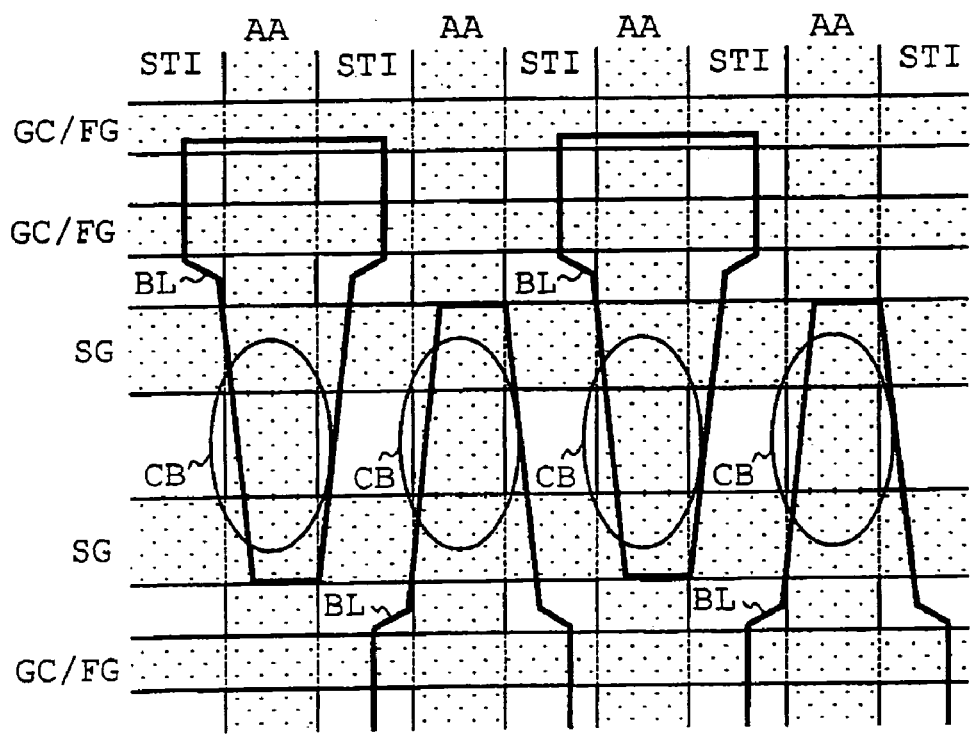
FIG. 17B is a typical plan view showing a case where a mask has displaced during the forming of bit line.
Figure 18:
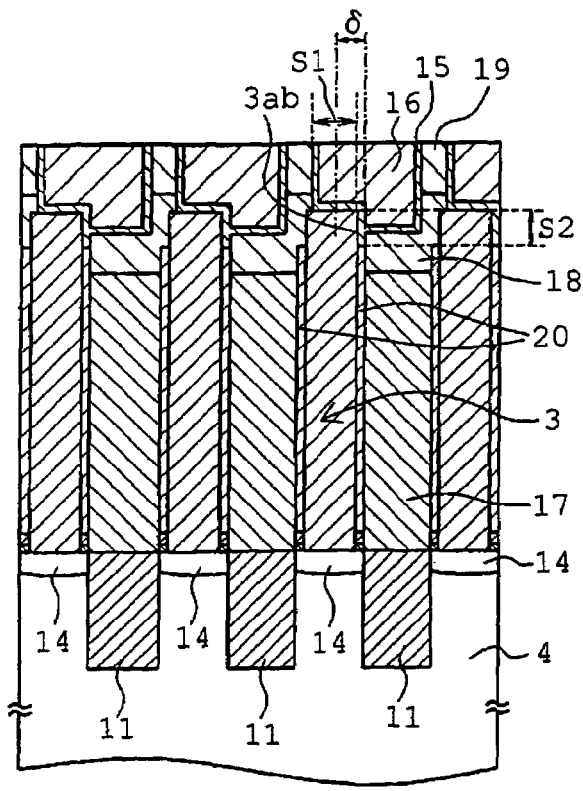
FIG. 18 is a typical sectional view showing a case where a mask has displaced during the forming of bit line.
Figure 19:
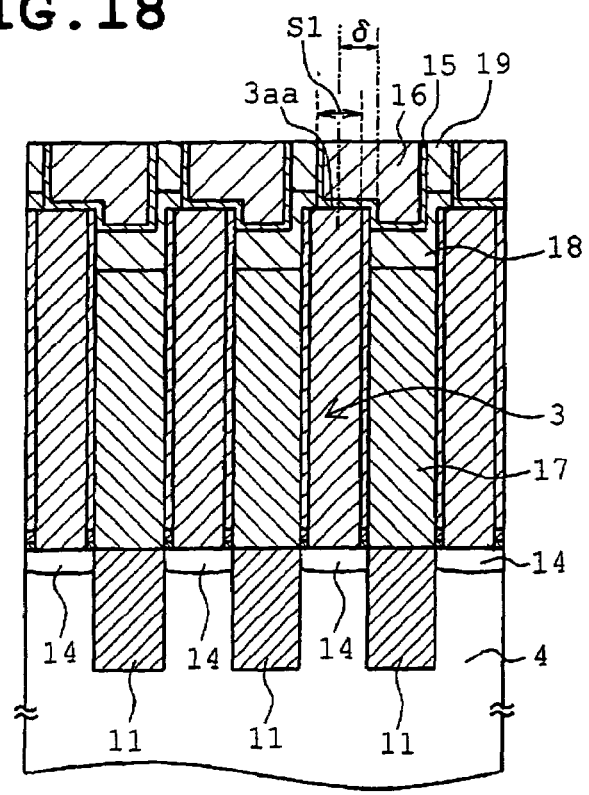
FIG. 19 is a typical sectional view showing a case where a mask has displaced during the forming of bit line.

Furthermore, no problem arises in the case where the photolithography technique applied to bit line forming region does not result in misalignment of mask when the bit line BL (titan layer 15 and tungsten layer 16) is formed, as shown in FIG. 17A. However, as shown in FIG. 17B, when the photolithography technique results in occurrence of misalignment particularly in the direction of word line (the direction in which the gate electrode is formed), the titan layer 15 is brought into contact only with the upper surface 3aa of the layer 3, whereupon the contact area Si is reduced as shown in FIG. 19 schematically illustrating the contact of the titan layer 15 with the third polycrystalline silicon layer 3.

According to the fabrication method of the embodiment, the upper part of the third silicon nitride film 20 is removed from the upper side face 3ab of the outer peripheral sidewall of the third polycrystalline silicon layer 3 although the resistance value may be increased with reduction in the contact area upon occurrence of mask misalignment. Since the third polycrystalline silicon layer 3 and titan layer 15 are brought into contact (see contact area S2) with each other on the upper side face 3ab, the reduction in the contact area can be suppressed even when the contact area (see contact area Si) is reduced between the upper surface 3aa and the titan layer 15. Consequently, the reduction in the contact area can be suppressed.

Figures 20A, 20B, 20C:
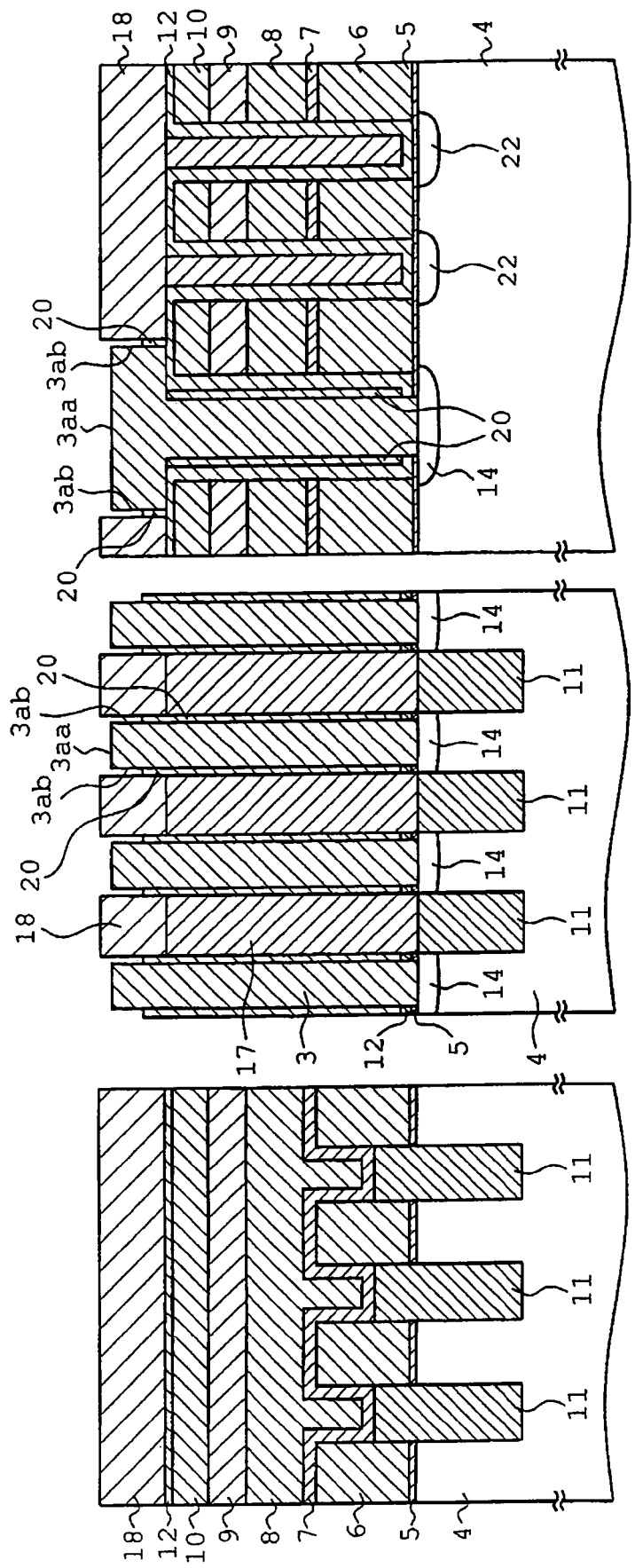
FIG. 20 schematically illustrates a fabrication step of a semiconductor device of a second embodiment in accordance with the present invention.

FIGS. 20A to 20C illustrate a second embodiment of the invention. The second embodiment differs from the foregoing embodiment in the fabrication process. In the second embodiment, identical or similar parts are labeled by the same reference symbols as those in the first embodiment and the description of these parts will be eliminated. Only the difference between the first and second embodiments will be described.

The following fabricating step is executed after the step described with reference to FIGS. 12A to 12C. That is, the upper portion (the upper side face 3ab) of the third silicon nitride film 20 is removed downward from the upper surface 3aa under the etching condition with higher selectivity with respect to the third silicon oxide film 18 of the third polycrystalline silicon layer 3, as shown in FIGS. 20A to 20C. The fourth silicon oxide film 19 is formed on the third silicon oxide film 18 in the same manner as in the first embodiment and thereafter, the third and fourth silicon oxide films 18 and 19 are removed under the etching condition with higher selectivity with respect to the third polycrystalline silicon layer 3 and the third silicon nitride film 2, although this is not shown. The titan layer 15 and tungsten layer 16 are then formed in the same manner as in the first embodiment. Consequently, the second embodiment can achieve substantially the same effect as the first embodiment.

Figures 21A, 21B, 21C:
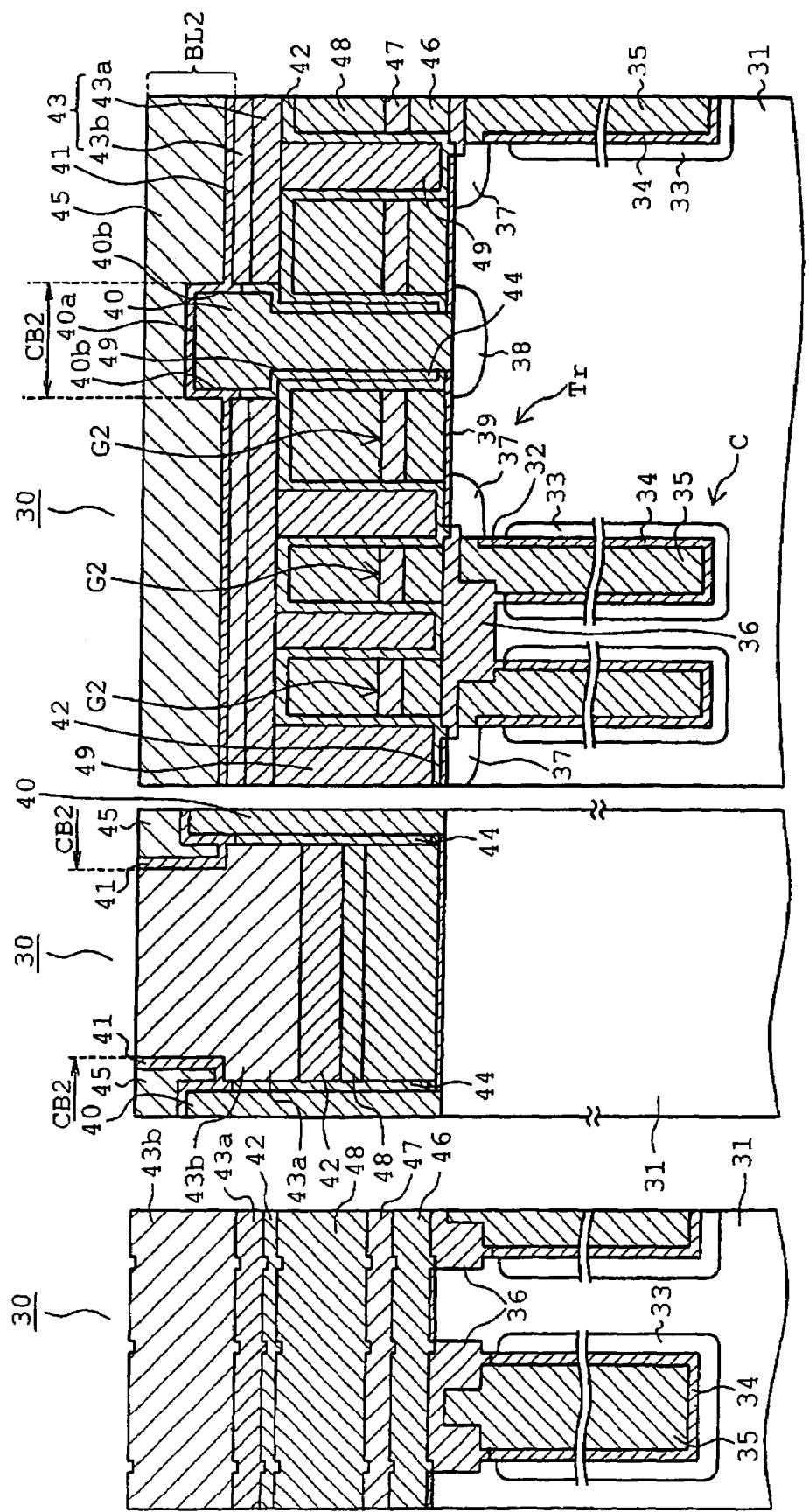
FIGS. 21A to 21C are schematic sectional views of a semiconductor device of a third embodiment in accordance with the present invention, the views being taken along lines 21A-21A, 21B-21B and 21C-21C in FIG. 22A respectively.

FIGS. 21A to 21C illustrate a third embodiment of the invention. The third embodiment differs from the foregoing embodiments in that the invention is applied to a DRAM semiconductor memory with the trench capacitor structure.

Figure 22A:
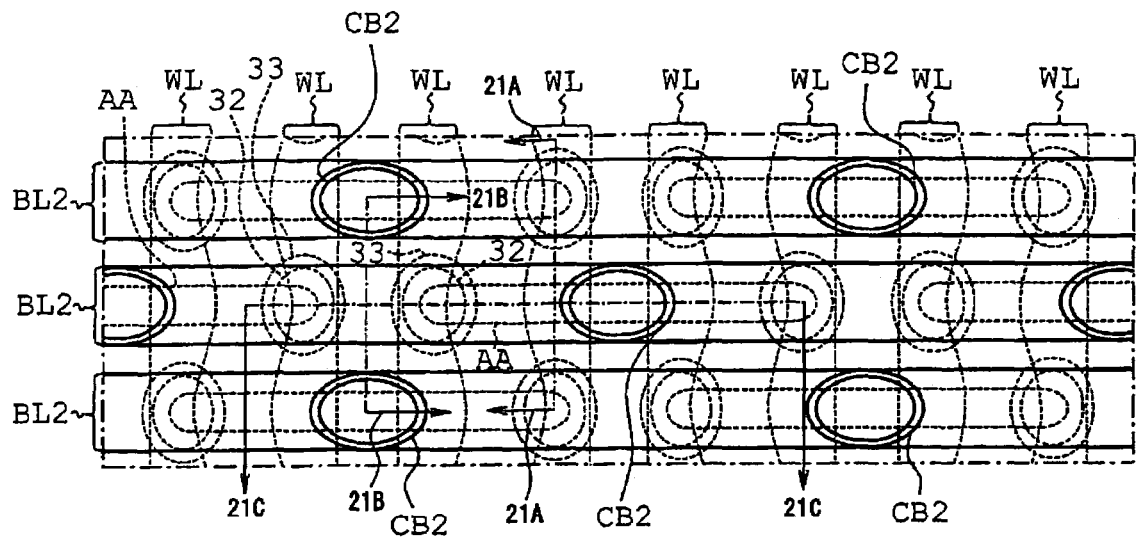
FIG. 22A is a typical plan view showing a case where a mask of bit line has not displaced.

The structure of the DRAM semiconductor memory will first be described with reference to FIGS. 21A to 22B. FIG. 22A is a typical plan view of the DRAM semiconductor memory. FIG. 21A is a longitudinally sectional view of the DRAM semiconductor memory taken along line 21A-21A in FIG. 22A. FIG. 21B is a longitudinally sectional view of the DRAM semiconductor memory taken along line 21B-21B in FIG. 22A. FIG. 21C is a longitudinally sectional view of the DRAM semiconductor memory taken along line 21C-21C in FIG. 22A.

Referring to FIGS. 21A to 21C, the DRAM semiconductor memory 30 as the semiconductor device includes a plurality of memory cells arranged in a memory cell region. Each memory cell comprises a cell transistor Tr of the MOS type and a trench capacitor C. The silicon semiconductor substrate 31 is formed with a deep trench 32. The trench capacitor C is formed in the trench 32 so as to be located at the bottom side. The trench 32 is formed into an elliptic shape as shown in FIG. 22A.

The structure of the trench capacitor C will be described. A plate diffusion layer 33 is formed around the trench 32 so as to extend from the bottom side of the trench 32 to a predetermined height. The plate diffusion layer 33 serves as a plate electrode of the trench capacitor C. A capacitor insulating film 34 is formed on an inner wall of the trench 32 and on the plate diffusion layer 33. The capacitor insulating film 34 comprises an $SiN$—$SiO_2$ film, $Al_2O_3$—$SiO_2$ film or $HfO_2$—$SiO_2$ film and serves as an insulating film for isolation of both plate electrodes of the trench capacitor C.

A first conductive layer 35 of a polycrystalline silicon layer or polycide is formed on the inner wall of the trench 32 and on the capacitor insulating film 34. The first conductive layer 35 serves as a plate electrode of the trench capacitor C. Thus, the trench capacitor C comprises the first conductive layer 35, capacitor insulating film 34 and plate diffusion layer 33.

A shallow trench isolation (STI) 36 or element isolation region is formed on an upper part of the first conductive layer 35. STI 36 is a layer formed to be opposite to the cell transistor Tr so as to isolate each memory cell from the adjacent one as shown in FIGS. 21A to 21C. STI 36 further has a function of isolating the trench capacitor C from a word line WL (gate electrode G2) formed to pass over STI 36 as shown in FIG. 21C.

The cell transistor Tr is adjacent to the trench capacitor C and is formed at a predetermined side of the trench 32 so as to be connected to the trench capacitor C. The cell transistor Tr includes the gate electrode G2 further serving as a word line WL, n-type diffusion layers 37 and 38 (source/drain diffusion layers) and first silicon oxide film 39 serving as a gate insulating film. The first conductive layer 35 composing the trench capacitor C is connected to the diffusion layer 37.

A second polycrystalline silicon layer 40 (bit line contact; and corresponding to a connected wiring layer) is formed on the upper part of the diffusion layer 38 (corresponding to a lower conductive layer). The second polycrystalline silicon layer 40 electrically connects the diffusion layer 38 to the bit line BL2. A titan layer 41 composing an upper layer side bit line BL2 is in contact with the diffusion layer 38 via the second polycrystalline silicon layer 40. The titan layer 41 is electrically connected via the second polycrystalline silicon layer 40 to the diffusion layer 38.

A first silicon nitride film 42 is formed so as to cover the gate electrode G2. The first silicon nitride film 42 serves as an insulating film for isolating each gate electrode G2 from the adjacent one. The first silicon nitride film 42 also serves as a gate sidewall insulating film. An interlayer dielectric film 43 (corresponding to a first insulating film) is formed so as to isolate the bit line BL from the memory cell. A second silicon nitride film 44 (corresponding to a second insulating film) serving as a spacer is formed on an outer peripheral sidewall of the second polycrystalline silicon layer 40. The second silicon nitride film 44 is adapted to be brought into contact with the titan layer 41 at an upper surface 40a and an upper side face of the silicon layer 40.

A tungsten layer 45 is formed on the titan layer 41. The titan layer 41 and tungsten layer 45 constitute the bit line BL2. Each memory cell is thus constituted. A plurality of the memory cells are arranged closely as shown in FIG. 22A. An active area AA in FIG. 22A indicates an active area of each memory cell.

Figure 22B:
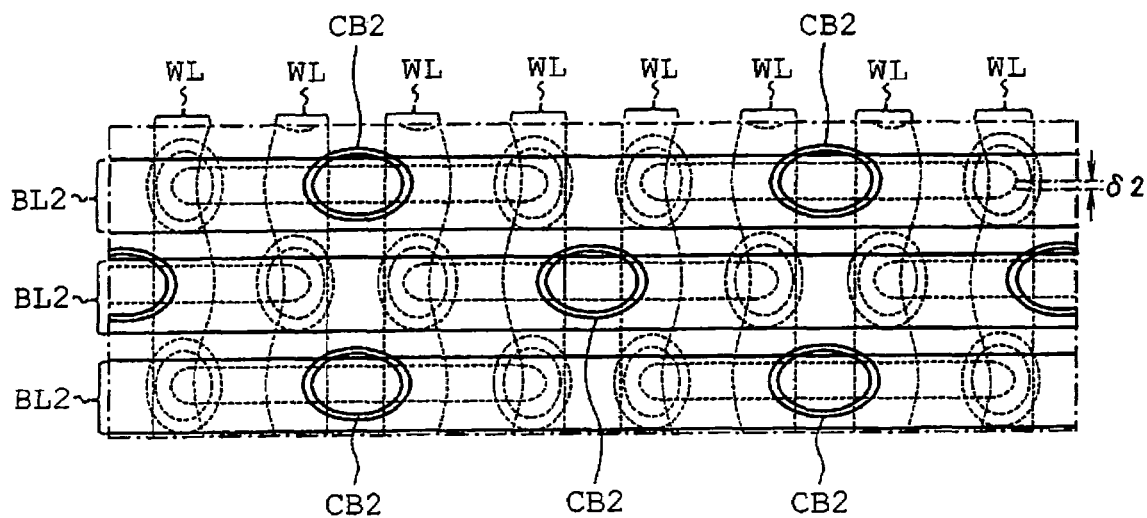
FIG. 22B is a typical plan view showing a case where a mask of bit line has displaced.

In this case, as shown in FIG. 22A, when the bit line BL (titan layer 41 and tungsten layer 45) is formed without misalignment of the mask in the vertical direction, an electrical interaction can be ignored between the bit line BL2 and the adjacent second polycrystalline silicon layer 40 since the distance between them is long. However, the distance has recently been reduced with recent reduction in the design rules. Accordingly, when mask misalignment δ2 is produced during the forming of the bit line BL as shown in FIG. 22B, the distance between the bit line BL2 and the adjacent second polycrystalline silicon layer 40 is also reduced, and a contact area between them is also reduced. In the embodiment, however, the second polycrystalline silicon layer 40 is brought into contact with the bit line BL at the upper side face as well as at the upper surface thereof. Consequently, reduction in the contact area between the bit line BL2 and the silicon layer 40 can be suppressed, and the resistance in the contact portion can be suppressed.

The following describes a manner of forming layers in the case where the aforesaid functional portions are formed, with reference to FIGS. 21A to 31C. The embodiment is characterized particularly by a portion for connecting the bit line BL2 (titan layer 41) and a contact plug (second polycrystalline silicon layer 40) and its peripheral portion. Accordingly, an upper layer on the substrate 31 pertaining to the characteristic portion will be described and a method of fabricating the trench capacitor and gate electrode G2 will be eliminated.

Figure 24A:
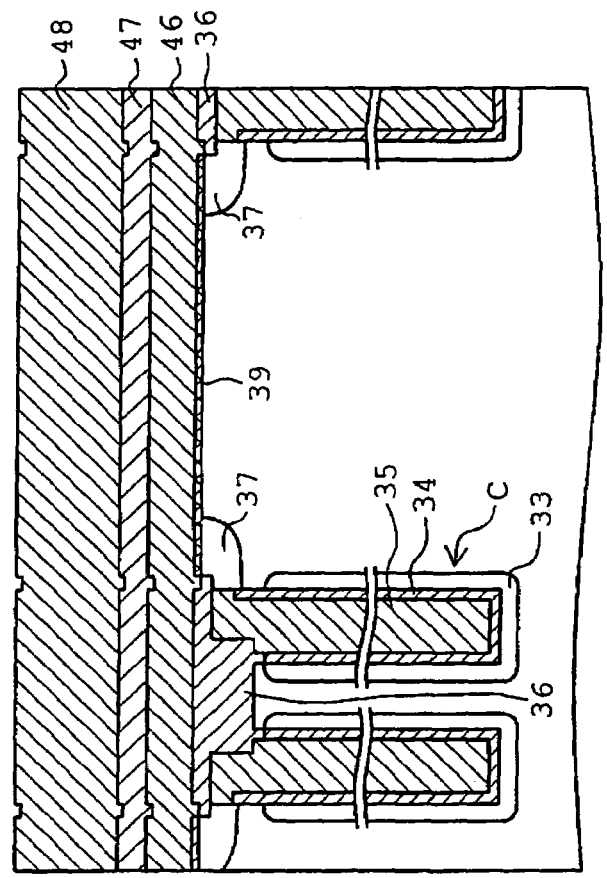
FIGS. 24A to 24C typically illustrate a fabrication step (step 2)
Figure 24B:
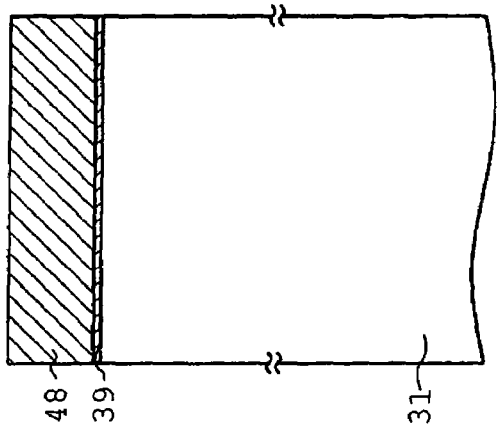
Figure 24C:
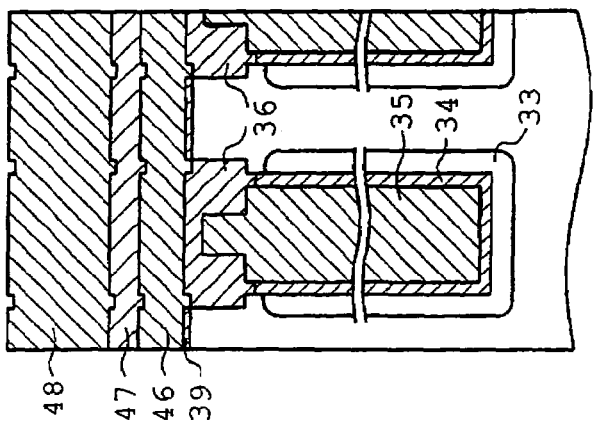

1. Method of fabricating the structure as shown in FIGS. 23A to 25C:

A silicon oxide film with the film thickness of 8 nm, for example, is formed on the p-type silicon semiconductor substrate 31 as the first silicon oxide film 39 which further serves as a gate insulating film. A gate electrode G2 is formed after the trench capacitor C and STI 36 have been formed. FIGS. 24A to 24C illustrate a method of forming the gate electrode G2. A first polycrystalline silicon layer 46 doped with impurity is formed by the low pressure CVD-process on the first silicon oxide film 39 so as to have a film thickness of 100 nm. A tungsten silicide layer 47 is formed on the first polycrystalline silicon layer 46 so as to have a film thickness of 55 nm. The third silicon nitride film 48 is formed on the tungsten silicide layer 47 by the low pressure CVD process so as to have a film thickness of 200 nm. Photoresist (not shown) is then applied to the third silicon nitride film 48 and then formed into a predetermined resist pattern by the photolithography technique. The third silicon nitride film 48 is then etched by the RIE process with the resist pattern serving as a mask. As a result, the first polycrystalline silicon layer 46 and tungsten silicide layer 47 are separated from each other. The gate electrode G2 is constituted by the first polycrystalline silicon layer 46 and the tungsten silicide layer 47, and the third silicon nitride film 48 between the gate electrodes G2 is removed.

Subsequently, the photoresist is removed by ashing. The tungsten silicide layer 47 and the first polycrystalline silicon layer 46 doped with impurity are processed by the RIE process with the remaining third silicon nitride film 48 serving as a mask. As a result, the first polycrystalline silicon layer 46 and the tungsten silicide layer 47 are removed. Thereafter, the RTO process is applied at about 1050° C. and the first silicon nitride film 42 is isotropically formed so as to have a film thickness of 40 nm. Consequently, the thin first silicon nitride film 42 is formed as a gate sidewall insulating film between the gate electrodes G2 as shown in FIGS. 25A to 25C.

Figures 26A, 26B, 26C:
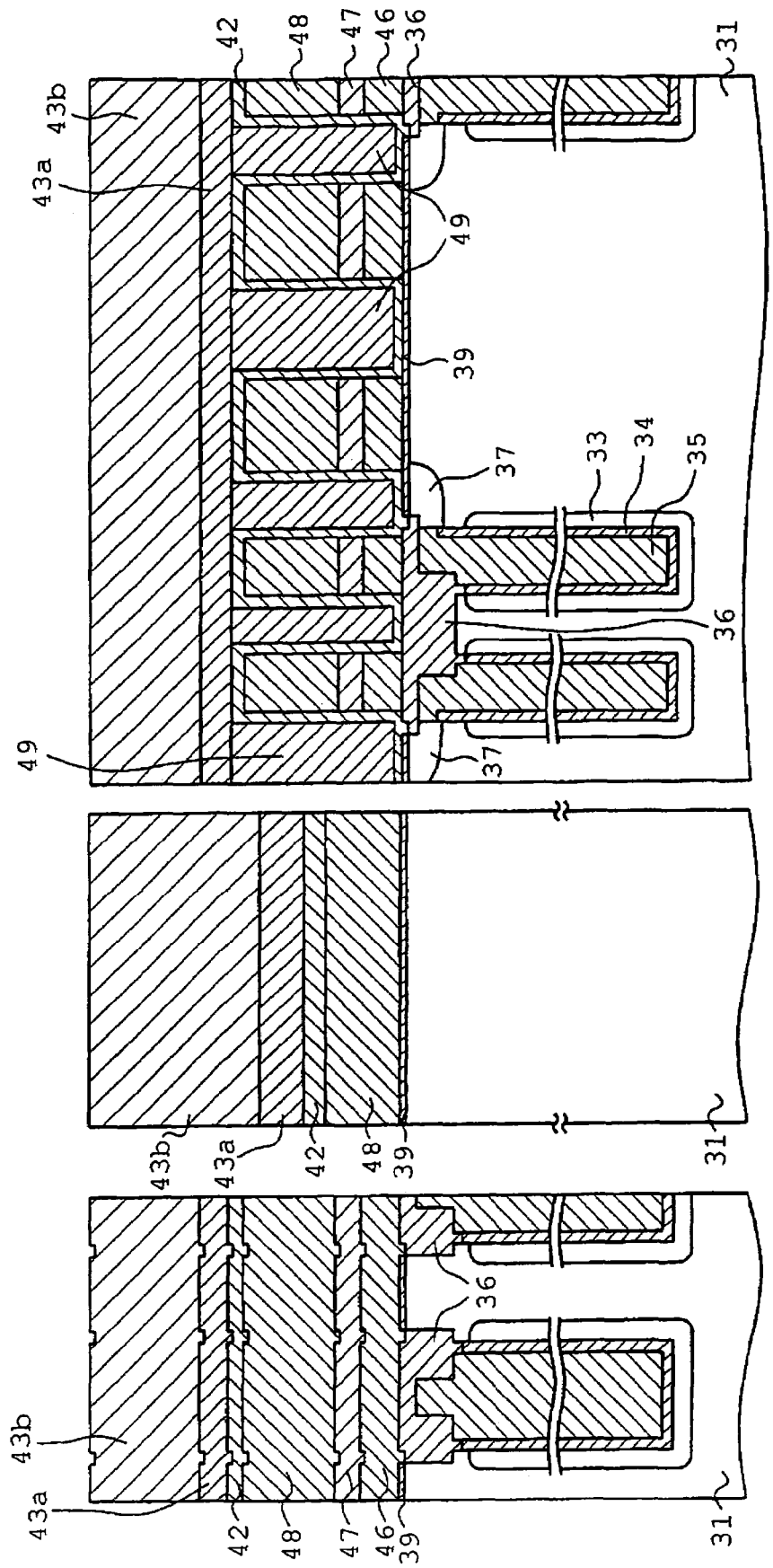
FIGS. 26A to 26C typically illustrate a fabrication step (step 4)

2. Method of fabricating the structure as shown in FIGS. 26A to 26C:

After completion of the above-described fabricating step 1, a fourth silicon oxide film 49 is formed between gate electrodes G2. The fourth silicon oxide film 49 formed on the first silicon nitride film 42 is then flattened by the CMP process with the first and third silicon nitride films 42 and 48 serving as stoppers. Subsequently, the second silicon nitride film 43a is formed on the exposed first or third silicon nitride film 42 or 48 and the fourth silicon oxide film 49 so as to have a film thickness of 150 nm, for example. Thereafter, the third silicon oxide film 43b is formed on the second silicon oxide film 43a so as to have a film thickness of 350 nm, for example. Thus, the second and third silicon oxide films 43a and 43b are formed as shown in FIGS. 26A to 26C. Upon completion of the forming step, the second and third silicon oxide films 43a and 43b serve as the interlayer dielectric film 43.

Figures 27A, 27B, 27C:
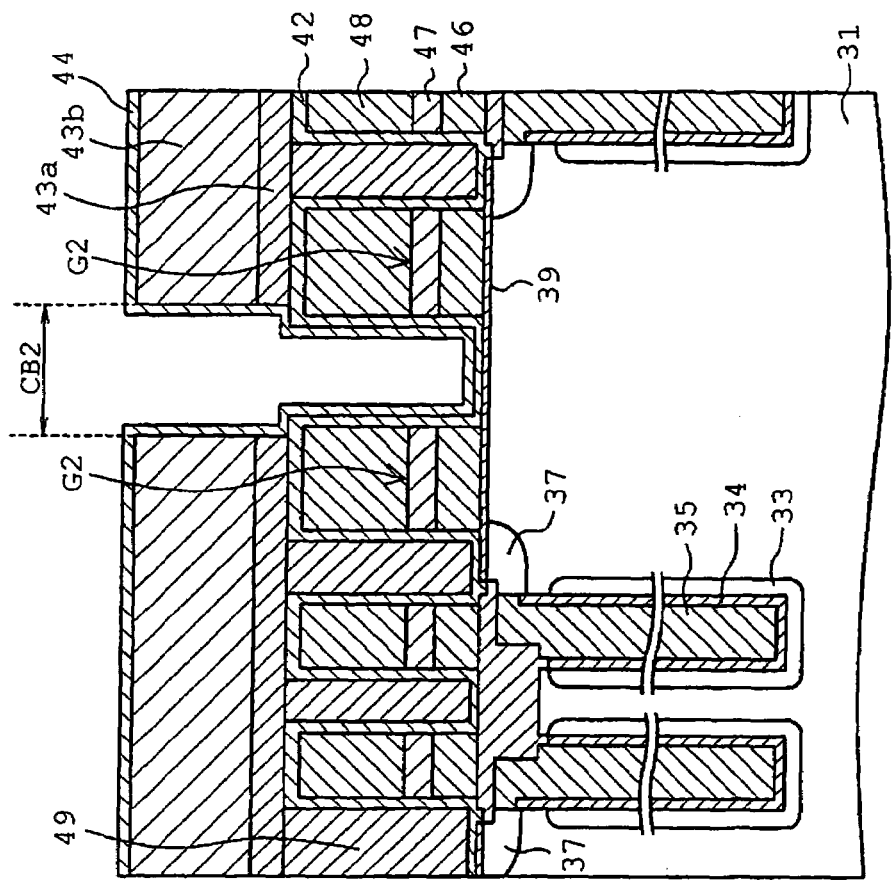
FIGS. 27A to 27C typically illustrate a fabrication step (step 5)

After completion of the above-described fabricating step 2, photoresist is applied to the third silicon oxide film 43b and is formed into a predetermined resist pattern by the photolithography technique. Thereafter, the second and third silicon oxide films 43a and 43b are processed (removed) by the RIE process with the photoresist serving as a mask. Furthermore, as shown in FIGS. 27A to 27C, the fourth silicon oxide film 49 is removed from a part to be formed as the bit line contact forming region CB2 by the self-aligning contact forming technique, and the second silicon nitride film 44 is isotropically formed on the part. The second silicon nitride film 44 serves as a spacer.

The second and first silicon nitride films 44 and 42 formed right on the substrate 4 and on the bottom between the gate electrodes G2 and the first silicon oxide film 39 are dry-etched. Consequently, the second silicon nitride film 44 remains on the sidewall of each gate electrode G2 such that a hole is formed. N-type impurity is diffused through the hole to the substrate 31, whereby the source/drain diffusion layer 38 is formed.

Subsequently, a polycrystalline silicon doped with impurity is formed inside the second silicon nitride film 44, whereby the second polycrystalline silicon layer 40 serving as a contact plug is formed. As shown in FIGS. 28A to 28C, an upper part of the second polycrystalline silicon layer 40 is removed by the chemical dry etching (CDE) process for height adjustment. Furthermore, the heating treatment is carried out at 970° C. in a nitric atmosphere so that dopant is activated.

Figures 29A, 29B, 29C:
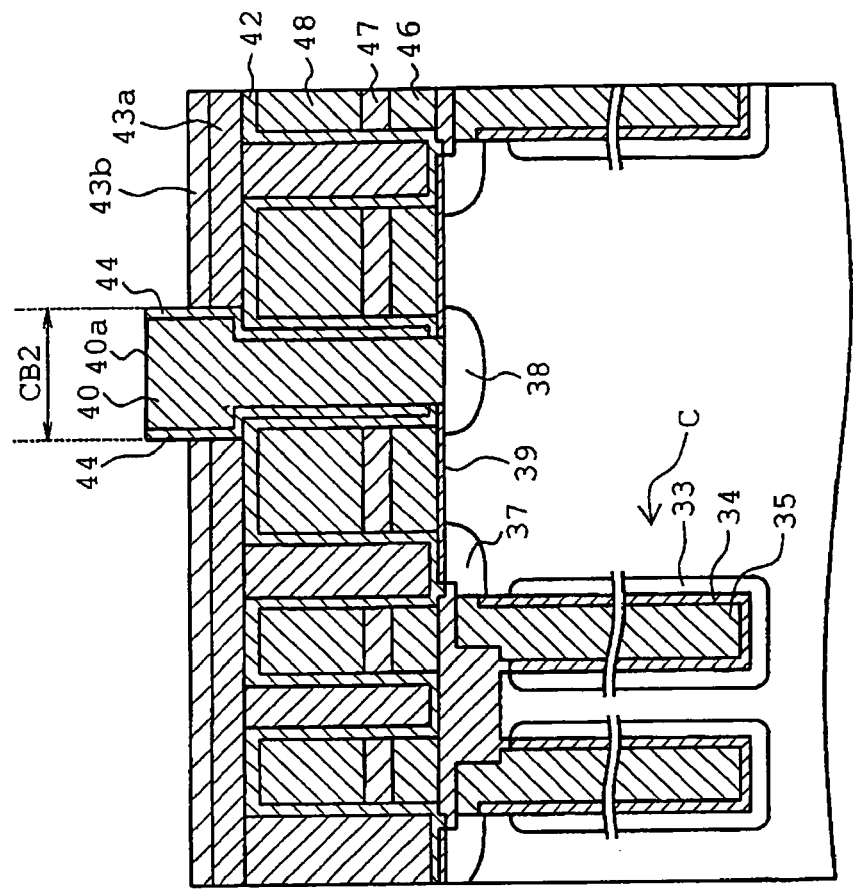
FIGS. 29A to 29C typically illustrate a fabrication step (step 7)

The third silicon oxide film 43b is removed by etching until a portion lower than the upper surface 40a of the second polycrystalline silicon layer 40 is reached, under the condition with higher selectivity with respect to the polycrystalline silicon and silicon nitride film. As a result, as shown in FIG. 29, the second silicon nitride film 44 is simultaneously removed until the upper surface 40a of the second polycrystalline silicon layer 40 is reached.

The second silicon nitride film 44 formed on the upper sidewall of the silicon-layer 40 is removed by the wet etching such as phosphating at 150° C. as shown in FIGS. 30A to 30C. In this case, the second silicon nitride film 44 is removed by wet etching under the condition with higher selectivity with respect to the silicon oxide film and polycrystalline silicon until a part lower than the upper surface 40a of the silicon layer 40 is reached, whereupon the upper side face 40b of the second polycrystalline silicon layer 40 is exposed.

In this case, it is desirable that the second silicon nitride film 44 is removed so that the upper part of the second silicon nitride film 44 is located lower than the upper surface of the third silicon oxide film 43b. In this case, dry etching may be carried out for removal of the second silicon nitride film 44.

Furthermore, the titan layer 41 is isotropically formed by the PVD process on the upper parts of second and-third silicon oxide films 43a and 43b and the upper part of the second silicon nitride film 44 so as to have a film thickness of about 45 nm, as shown in FIGS. 31A to 31C. As a result, the titan layer 41 is formed so as to be in contact with the upper surface 40a and upper side face 40b of the second polycrystalline silicon layer 40. Furthermore, heat treatment is carried out at 550° C. in a hydrogen-containing nitric atmosphere for 90 minutes.

Subsequently, as shown in FIGS. 21A to 21C, the tungsten layer 45 is deposited by the PVD process on the titan layer 41 so as to have a film thickness of 400 nm, for example. The tungsten layer 45 and the titan layer 41 are flattened as shown in FIG. 21B. heat treatment is carried out at 400° C. in a hydrogen-containing nitric atmosphere for 30 minutes. Thus, a contact portion between the second polycrystalline silicon layer 40 serving as bit line contact (contact plug) and the bit line BL is constituted.

In the above-described third embodiment, too, the second polycrystalline silicon layer 40 and bit line BL are brought into contact with each other at the upper side face 40b of the second polycrystalline silicon layer 40 as well as at the upper surface 40a of the layer 40. Consequently, the third embodiment can achieve substantially the same effect as the first embodiment. Furthermore, the invention can be applied to the, DRAM semiconductor memory.

FIGS. 32A to 32C illustrate a fourth embodiment of the invention. The fourth invention differs from the third embodiment in the fabricating method. In the fourth embodiment, identical or similar parts are labeled by the same reference symbols as those in the third embodiment and the description of these parts will be eliminated. Only the difference between the third and fourth embodiments will be described.

After the forming of the structure as shown in FIGS. 28A to 28C, the second and first silicon nitride films 44 and 42 and the first silicon oxide film 39 all located on the upper surface of the diffusion layer 38 are removed and the second polycrystalline silicon layer 40 is formed. After the height of the second polycrystalline silicon layer 40 has been adjusted, the second silicon nitride film 44 formed on the upper side face 40b of the second polycrystalline silicon layer 40 is removed.

In this case, the second silicon nitride film 44 is removed under the condition with higher selectivity with respect to the silicon oxide film and polycrystalline silicon. The second silicon nitride film 44 is removed so that the upper part of the second silicon nitride film 44 is located lower than the upper surface 40a of the second silicon layer 40, whereupon the upper side face 40b of the second silicon layer 40 is exposed.

Thereafter, as shown in FIGS. 21A to 21C, the third silicon oxide film 43b is etched under the condition with higher selectivity with respect to the polycrystalline silicon and silicon nitride film, whereby the upper part of the third silicon oxide film 43b is removed until the part lower than the upper surface 40a of the second silicon layer 40 and the part higher than the second silicon nitride film 44 are reached.

The titan layer 41 is formed on the third silicon oxide film 43b, the upper surface 40a and upper side face 40b of the second silicon layer 40 in the same manner as in the foregoing embodiment. The tungsten layer 45 is formed on the titan layer 41. As a result, the same structure as in the foregoing embodiment can be obtained. The fourth embodiment can achieve substantially the same effect as the third embodiment.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
   a semiconductor substrate including a first upper surface having an active area extending in a first direction;
   a gate insulating film formed on the active area:
   a pair of gate electrodes having respective first side surfaces and formed on the gate insulating film, each gate electrode including a conductive portion and a first insulating film formed on the conductive portion;
   a first silicon oxide film having second side surfaces opposed to each other and formed above the gate electrodes;
   a plurality of bit lines formed on the first silicon oxide film and extending in the first direction, each bit line including a lower surface having a recess;
   a contact plug located between the gate electrodes so as to electrically connect one of the bit lines and the active area and including a first portion having a third side surface interposed between the gate electrodes, a second portion having a fourth side surface located between the opposed second side surfaces of the first silicon oxide film, and a third portion having an upper surface and fifth side surface embedded in each recess of the bit line;
   a first silicon nitride layer located between the third side surface of the first portion of the contact plug and the first side surface of the gate electrode;
   a second silicon nitride layer located between the fourth side surface of the second portion of the contact plug and the second side surfaces of the first silicon oxide film; and
   a second silicon oxide film formed on the first silicon oxide film,
   wherein the entire upper surface and fifth side surface of the third portion of the contact plug directly contacts with an inner surface of each recess.

2. The semiconductor device according to claim 1, wherein the bit line includes a tungsten layer and a titanium layer formed on the tungsten layer.

3. The semiconductor device according to claim 1, wherein the contact layer includes a polycrystalline silicon layer.

4. The semiconductor device according to claim 1, wherein the gate electrodes constitute select gate transistors of a NAND type non-volatile semiconductor memory device.

5. The semiconductor device according to claim 1, wherein the upper portion of the contact plug includes an-elliptic cylinder shape.

6. The semiconductor device according to claim 1, wherein the contact plug includes a T-shaped longitudinal section.

7. The semiconductor device according to claim 1, wherein the upper portion of the contact plug includes an overhang portion located above the gate electrodes.

8. The semiconductor device according to claim 1, wherein the gate electrodes include a polycrystalline silicon layer and silicide layer located on the polycrystalline silicon layer.

9. The semiconductor device according to claim 8, wherein the silicide layer includes a tungsten silicide layer.

10. The semiconductor device according to claim 1, wherein the third portion of the contact plug includes a first width in a second direction perpendicular to the first direction, and the bit line includes a second width larger than the first width in the second direction.

11. The semiconductor device according to claim 10, wherein the fourth side surface of the second portion of the contact plug is flush with the fifth side surface of the third portion of the contact plug along the second direction.

12. The semiconductor device according to claim 1, wherein the third, fourth, and fifth side surfaces are flush with one another in the first direction.

13. The semiconductor device according to claim 1, wherein the second silicon nitride layer includes an upper end portion located at a level lower than a level of the lower surface of the bit line.

* * * * *